United States Patent [19]
Jones

[11] Patent Number: 5,804,986
[45] Date of Patent: Sep. 8, 1998

[54] MEMORY IN A PROGRAMMABLE LOGIC DEVICE

[75] Inventor: Christopher W. Jones, Pleasanton, Calif.

[73] Assignee: Cypress Semiconductor Corp., San Jose, Calif.

[21] Appl. No.: 580,626

[22] Filed: Dec. 29, 1995

[51] Int. Cl.$^6$ .................................................. H03K 19/177
[52] U.S. Cl. ................................................. 326/40; 326/39
[58] Field of Search .......................... 326/37–41, 46–47; 365/189.08

[56] References Cited

U.S. PATENT DOCUMENTS

| | | | |
|---|---|---|---|
| 4,592,019 | 5/1986 | Huang et al. | 365/189.08 |
| 5,559,450 | 9/1996 | Ngai et al. | 326/40 |
| 5,566,123 | 10/1996 | Freidin et al. | 326/38 |
| 5,572,148 | 11/1996 | Lytle et al. | 326/39 |

OTHER PUBLICATIONS

Knapp. "XC4000E Edge Triggered and Dual–Port RAM Capability", Xilinx, Inc., Jun. 20, 1995, pp. 1–3.
*Programmable Logic Data Book*. Xilinx, Inc., 1994, pp. 2–6–2–29.
*Intel Corporation Programmable Logic,* "AB–55 Application Brief, How to Use Registered SRAM Macrocells on the FLEXlogic iFX780 and iFX740 via PLDshell Plus Keywords", pp. 3:50–54, Document No.: Order No. 292121, Oct. 1993.
*Intel Corporation Programmable Logic,* "AB–28 Application Brief, Implementing FIFO's Using the iFX780 FPGA", pp. 3:9–14, Document No.: Order No. 292108–001, Oct. 1993.
Altera Corp. Data Sheet, "Flashlogic Programmable Logic Device Family", Chap. 6, pp. 221–241, Ver. 1, (Mar. 1995).

Altera Corporation Architecture Overview, "Flex 10K The First Embedded Programmable Logic Family", pp. 1–13, Ver. 1, Document No.: M–WP–EPLF10K–01 (Apr. 1995).
Altera Corp. Data Sheet, "Flex 10K Embedded Programmable Logic Family", pp. 1–29, Ver. 1, Document No.: A–DS–F10K01 (Jul. 1995).
*Intel Corporation Programmable Logic,* "iFX740 10 ns FLEXlogic FPGA with SRAM Option", pp. 2:1–23, Nov. 1993.
*Intel Corporation Programmable Logic,* "iFX780 10 ns FLEXlogic FPGA with SRAM Option", pp. 2:24–46, Nov. 1993.
*Intel Corporation Programmable Logic,* "iFX8160" 10 ns FLEXlogic FPGA with SRAM Option, pp. 2:47–69, Oct. 1993.

*Primary Examiner*—Jon Santamauro
*Attorney, Agent, or Firm*—Blakely, Sokoloff, Taylor & Zafman LLP

[57] ABSTRACT

A programmable logic device includes a plurality of logic blocks coupled to an interconnect matrix, wherein one of the plurality of logic blocks comprises configurable memory logic having control logic coupled to a storage element. The control logic receives a plurality of control signals from the interconnect matrix and performs substantially all logic functions required for the configurable memory logic to selectively function as each of a plurality of memory devices. The plurality of memory devices includes a first-in-first-out (FIFO) memory device, a last-in-first-out (LIFO) memory device, a single-port memory device (e.g. single-port SRAM) and a multi-port memory device (e.g. dual-port RAM). Additionally, multiple logic blocks may comprise configurable memory logic. Each logic block may perform a different memory function. These logic blocks can be cascaded together to form memory devices with greater memory depths and/or widths than possible with a single logic block with configurable memory logic.

34 Claims, 17 Drawing Sheets

MEMORY IN A PROGRAMMABLE LOGIC DEVICE

BACKGROUND OF THE INVENTION

1. Field of the Invention

The present invention relates to programmable logic devices.

2. Art Background

Programmable logic devices (PLDs, CPLDs, etc.) are popular general purpose logic devices which may be programmed to implement a variety of complex logic functions. FIG. 1 illustrates a conventional PLD 100. PLD 100 includes programmable interconnect matrix 102 coupled to dedicated input pins 104, logic blocks 122, 124, 126 and 128, and I/O cells 114, 116, 118 and 120. PLD 100 further includes I/O pins 106, 108, 110 and 112 which provide input signals to programmable interconnect matrix 102, and provide output signals from the I/O cells. I/O cells 114–120 support enabling and disabling functions associated with the normal operation of I/O pins 106–112.

Programmable interconnect matrix 102 routes signals between dedicated input pins 104, I/O pins 106–112, logic blocks 122–128 and I/O cells 114–120 such that programmable functions available in logic blocks 122–128 are accessible to each other and to the pins of PLD 100. The programmable interconnect of a PLD may comprise a single, programmable matrix, or a combination of multiple programmable matrices such as when input or output routing pools are included with a central interconnect matrix.

Logic blocks 122–128 comprise programmable logic elements which may be programmed through hardware and/or software to implement a number of logic functions. The general composition of a logic block, such as logic blocks 122–128, is illustrated in FIG. 2. FIG. 2 illustrates logic block 200 which comprises programmable logic 202 coupled to programmable macrocells 204. Programmable logic 202 typically comprises a programmable AND array and a programmable OR array, but may also comprise other programmable logic arrays including two programmable NAND arrays or two programmable NOR arrays. Programmable logic 202 receives input signals at node 210 from a programmable interconnect matrix, performs a logic function upon the input signals, and provides outputs signals to programmable macrocells 204 and at node 206. Programmable macrocells 204 typically contain additional logic elements such as register elements. Programmable macrocells 204 outputs signals at node 208. Logic block 200 may include additional flexibility by including shared or parallel expanders, but the structure of logic block 200 remains a unidirectional data flow from input signals at node 210 to output signals at nodes 206 and 208.

It is known in the art to provide single-port memory, such as static random access memory (SRAM), in place of a logic block, or as part of a logic block in a PLD. FIG. 3 illustrates logic block 300 containing a single-port 128×10 SRAM array 316 provided by Altera Corporation's FLASHlogic family of devices. Logic block 300 further comprises row decoder 314, column decoder 312, global clock select 304, an array of logic elements 306, OR gates 308 and 310, multiplexers 320 and 324, register element 318 and buffer 322 which are coupled together as generally shown in FIG. 3. Logic block 300 is additionally coupled to programmable interconnect matrix 302. Logic block 300 may comprise a bi-directional I/O data bus or utilize separate input and output data buses. Additionally, logic block 300 may be cascaded with other logic blocks in a PLD to increase the depth or width of the single-port memory available.

Altera Corporation also provides the FLEX 10K family of devices which implement and emulate memory functions. The FLEX 10K architecture contains logic blocks and embedded array blocks. As illustrated in FIG. 4a, embedded array block 400 includes single-port SRAM memory comprising RAM/ROM 408. Embedded array block 400 also contains row interconnect 404, column interconnect 406, local interconnect 402, multiplexers 410–426 and register elements 428–434 which are interconnected as generally shown in FIG. 4a. RAM/ROM 408 has a separate data input port and a separate data output port. RAM/ROM 408 may comprise a number of different depth and width configurations. Additionally, embedded array blocks may be cascaded together to increase the depth or width of the single-port memory available.

A FLEX 10K device may be used to emulate a FIFO function or a multi-port function by utilizing the single-port SRAM included in an embedded array block and generating the necessary control logic in the programmable logic blocks. FIG. 4b illustrates an emulated FIFO device 445 constructed within a FLEX 10K device. Emulated FIFO device 445 comprises an embedded array block 452 coupled to a logic block 450. Programmable logic available in logic block 450 is used to implement control logic 454, write pointer 456, read pointer 458 and multiplexer 460. Elements 454–460 provide the necessary control logic in order to emulate a FIFO function together with single-port SRAM 462 of embedded array block 452. However, due to the single-port nature of single-port SRAM 462, emulated FIFO device 445 can only emulate the function of a FIFO device, and cannot completely function as a conventional FIFO memory device. As illustrated, write pointer 456 and read pointer 458 must be multiplexed and shared by the address port of single-port SRAM 462. Therefore, the FIFO emulation illustrated in FIG. 4b cannot simultaneously write and read data information as in a conventional FIFO memory device. This limits the performance of emulated FIFO device 445.

In like manner, a FLEX 10K device can use the single-port memory of an embedded array block and the programmable elements in logic blocks to emulate a dual-port RAM. However, as with the emulation of the FIFO device, the emulated dual-port RAM cannot completely function as a conventional dual-port RAM device. The address information and the data information must be multiplexed and shared by a single address port and a single data port of the single-port SRAM included in the embedded array block. This significantly limits the performance of the emulated dual-port RAM.

A need exists for a PLD which has a logic block which includes multi-port memory. Employing multi-port memory in a logic block of a PLD would enable a dual-port memory device (or other multi-port memory device) to be completely implemented in a PLD. That is, a simultaneous read and write of data information to the multi-port memory device may be accomplished. A need also exists for a logic block which comprises, in whole or in part, a FIFO (or LIFO) memory device which is capable of performing a simultaneous read and write of data information. Additionally, a need exists for a PLD which includes a logic block comprising a configurable memory block that comprise multi-port memory and the necessary control logic to function as any combination of a FIFO memory device, a LIFO memory device, a single-port memory device, or a multi-port memory device. The use of multi-port memory devices (including FIFO and LIFO memory devices) in a PLD would increase design flexibility for logic designers utilizing PLDs, and may obviate the need for external memory devices. Additionally, the use of multi-port memory in a PLD would reduce the complexity of PLD programming software and make it easier for the PLD manufacturer to support and test the PLD over single-port memories emulating multi-port functions. Furthermore, multi-port memory in a PLD can be easily expanded in depth and width providing greater performance and design flexibility for the PLD user. Moreover, multi-port memory in a PLD will have better performance over a single-port memory in a PLD emulating multi-port memory functions.

SUMMARY OF THE INVENTION

A programmable logic device including a memory block is described. In one embodiment, the present invention comprises a programmable logic device including a plurality of logic blocks coupled to an interconnect matrix, wherein one of the plurality of logic blocks comprises configurable memory logic having control logic coupled to a storage element. The control logic receives a plurality of control signals from the interconnect matrix and performs substantially all logic functions required for the configurable memory logic to selectively function as each of a plurality of memory devices. The plurality of memory devices includes a first-in-first-out (FIFO) memory device, a last-in-first-out (LIFO) memory device, a single-port memory device (e.g. single-port SRAM) and a multi-port memory device (e.g. dual-port RAM).

In another embodiment of the present invention, a programmable logic device is described which includes a plurality of logic blocks coupled to an interconnect matrix. One of the plurality of logic blocks comprises a multi-port storage element having a plurality of ports, and is operable to function as a FIFO memory device, a LIFO memory device, a single-port memory device, or a multi-port memory device. The logic block with the multi-port storage element may function as one of the different memory types in response to receiving a memory select signal, or multiple memory select signals. The logic block with the multi-port storage element further comprises programmable logic elements and programmable macrocells coupled to the interconnect matrix. The programmable logic elements may comprise multi-port control logic, FIFO control logic, and/or LIFO control logic. The multi-port control logic may function as single-port control logic. Additionally, multiple logic blocks may comprise multi-port storage elements which can be cascaded together to form multi-port memory devices with greater memory depths and widths than a single multi-port storage element.

In another embodiment of the present invention, a programmable logic device is described which includes a plurality of logic blocks coupled to an interconnect matrix, wherein one of the plurality of logic blocks comprises a first-in-first-out (FIFO) storage element (or a last-in-first-out (LIFO) storage element). Data information may be substantially simultaneously written to and read from the FIFO storage element. The logic block with the FIFO storage element further comprises programmable logic elements and programmable macrocells coupled to the interconnect matrix. The programmable logic elements comprise FIFO control logic and/or LIFO control logic. Additionally, multiple logic blocks may comprise FIFO storage elements which can be cascaded together to form FIFO memory devices with greater memory depths and widths than a single FIFO storage element.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

A programmable logic device including a memory block is disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily. Additionally, the asterisk symbol "*" is used after signal names to indicate that a signal is an active low signal. Signal names using the nomenclature of "A/B*" indicate that when this signal comprises a high logic level the "A" function is enabled, and when this signal comprises a low logic level the "B" function is enabled. Additionally any active low (high) signal may appropriately be implemented as an active high (low) signal within the scope of the present invention.

Figure 1:
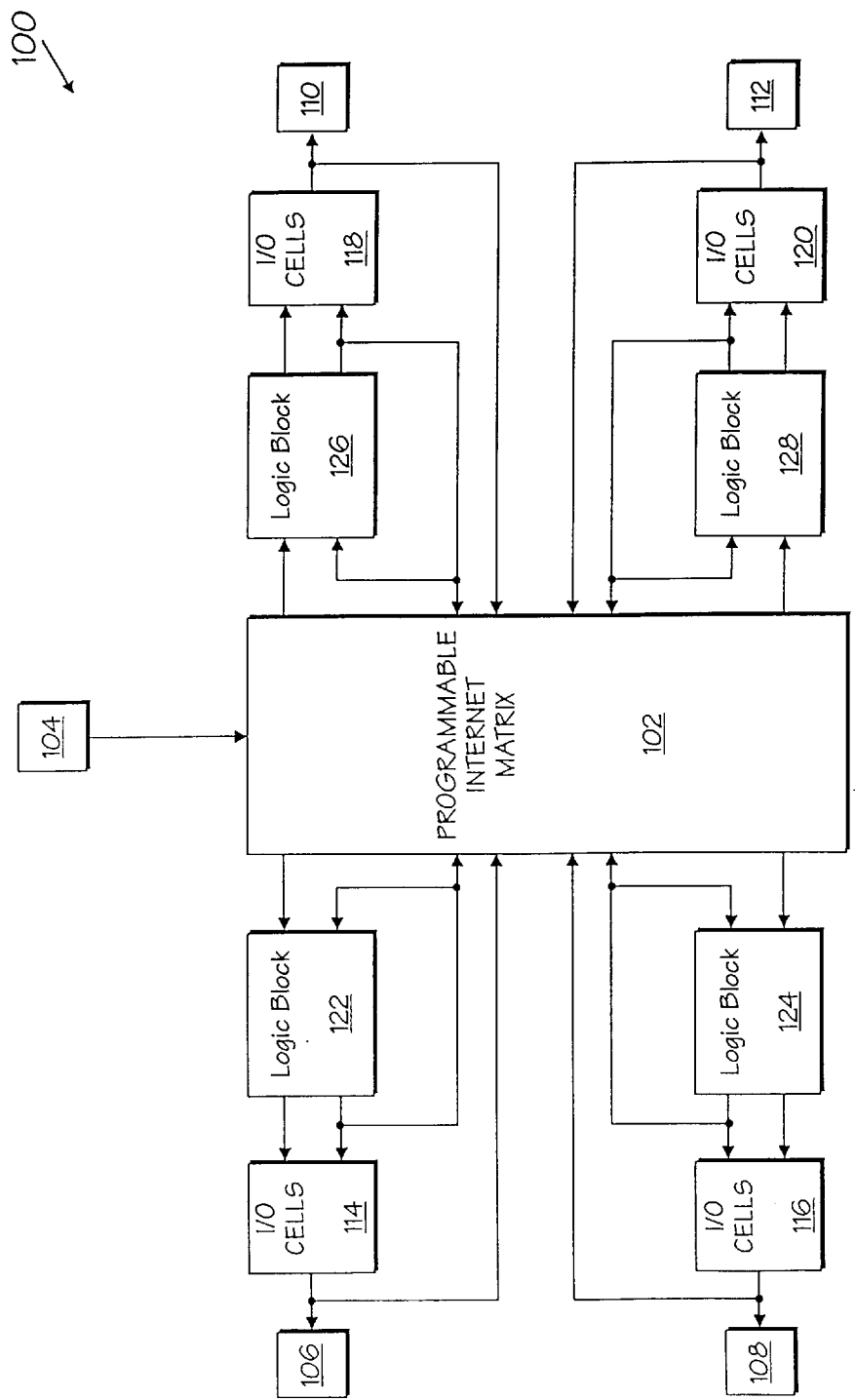
FIG. 1 illustrates a prior art programmable logic device.
Figure 2:
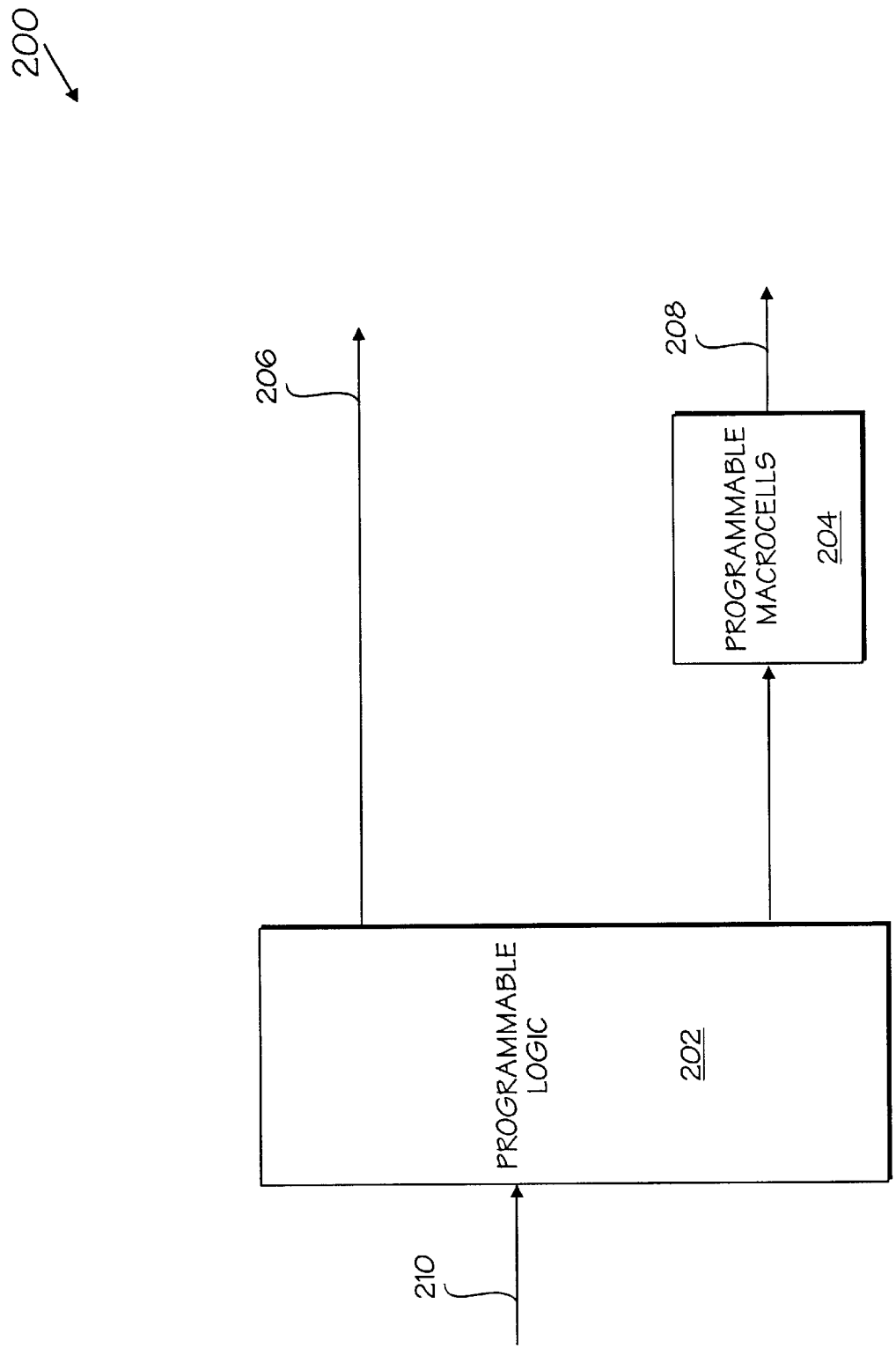
FIG. 2 illustrates a prior art logic block of a programmable logic device.
Figure 3:
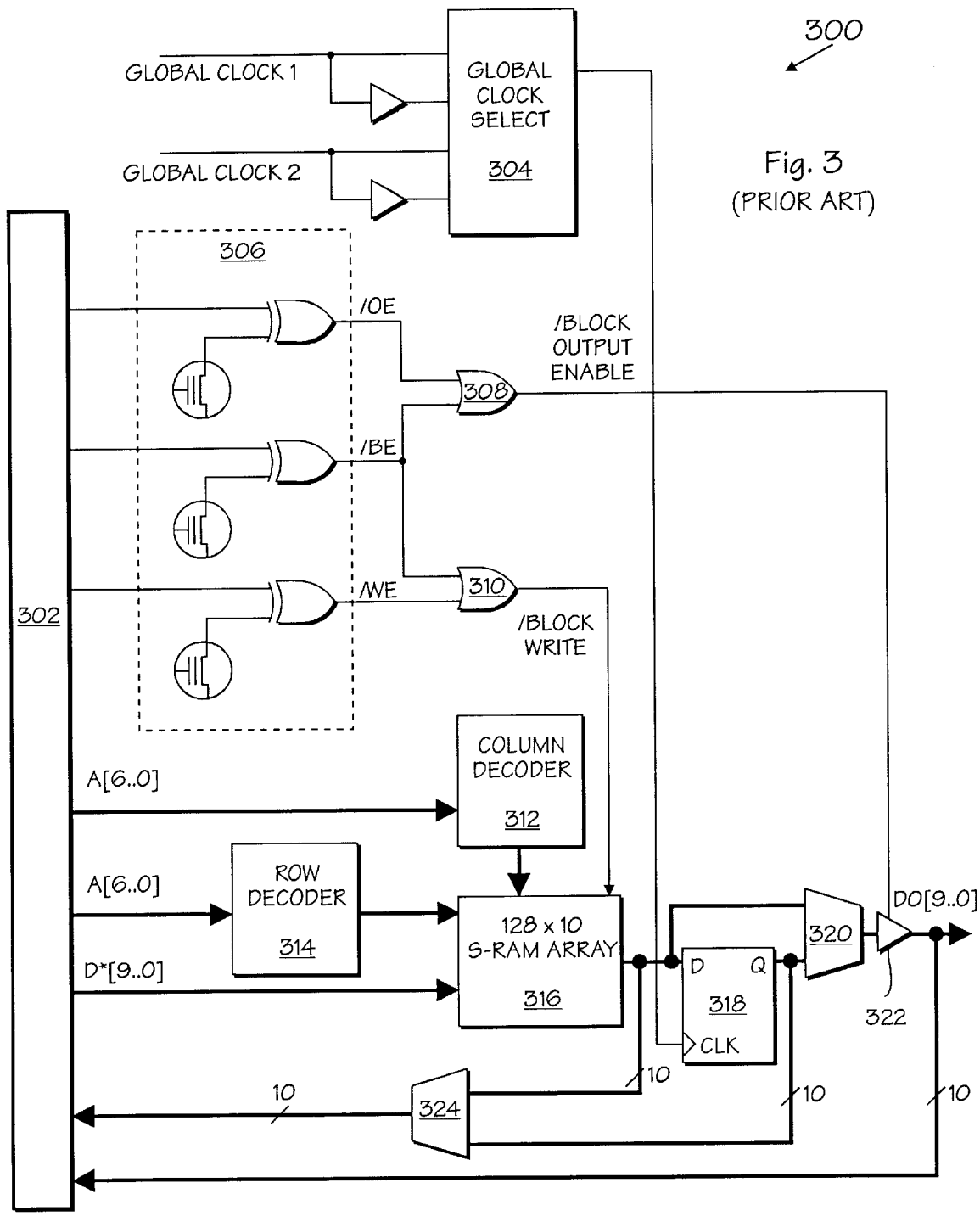
FIG. 3 illustrates a prior art logic block including static random access memory (SRAM).
Figure 4A:
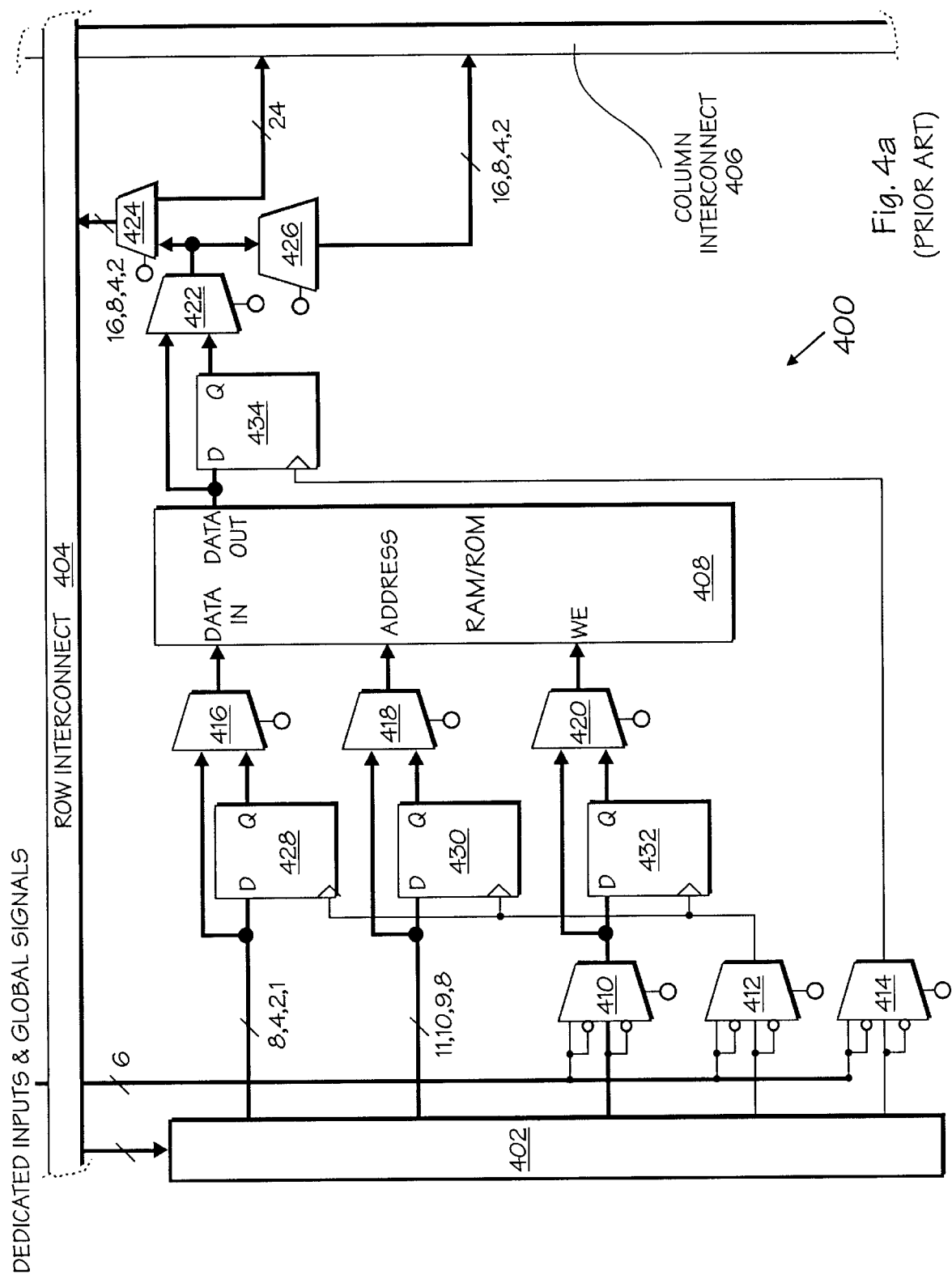
FIG. 4a illustrates a prior art embedded array block including SRAM.
Figure 4B:
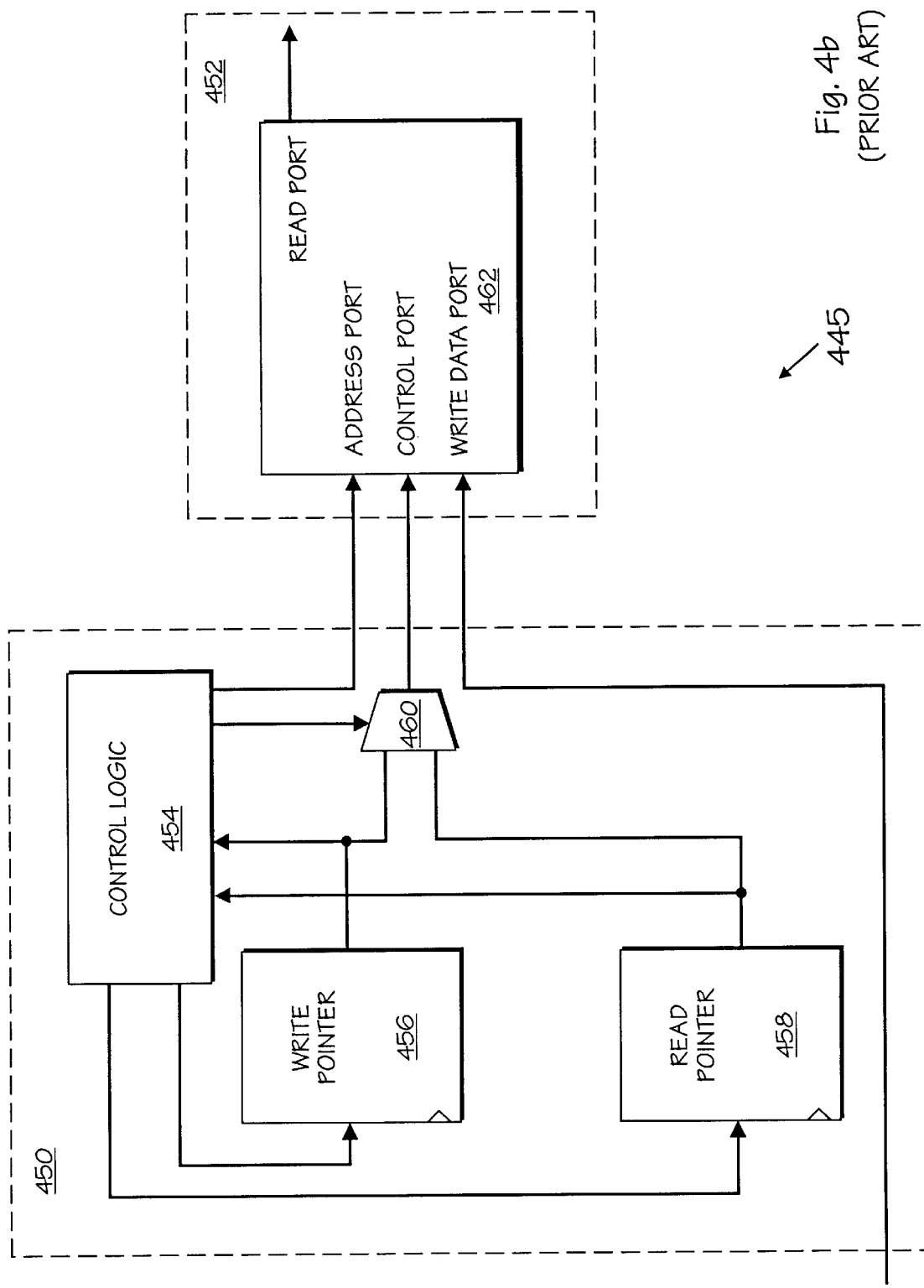
FIG. 4b illustrates the embedded array block of FIG. 4a interconnected with a logic block in order to emulate a first-in-first-out (FIFO) operation.
Figure 5:
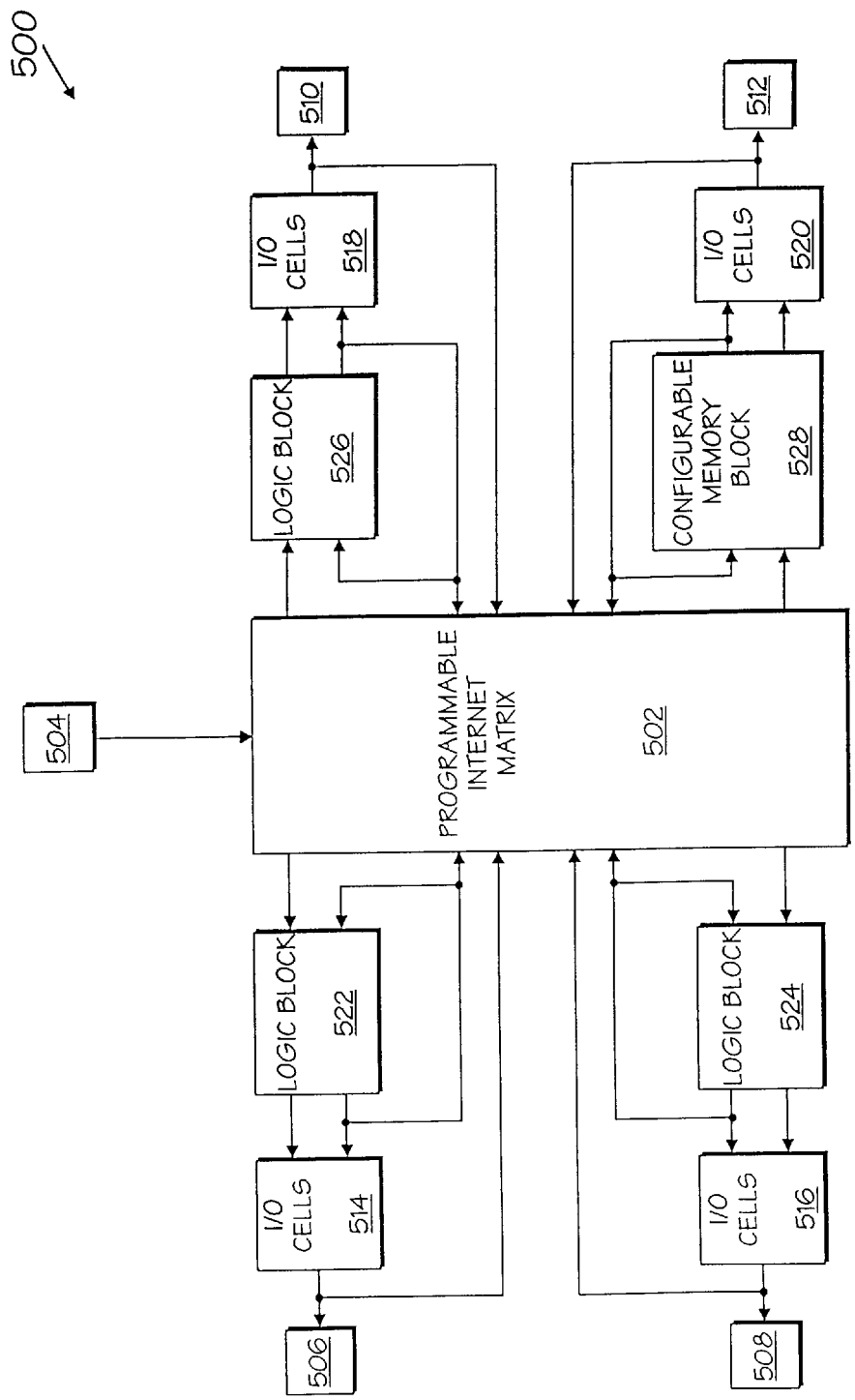
FIG. 5 illustrates one embodiment of a programmable logic device including a configurable memory block according to the present invention.

FIG. 5 illustrates a programmable logic device (PLD) 500 in which the present invention may be implemented. PLD 500 includes programmable interconnect matrix 502 coupled to dedicated input pins 504, logic blocks 522, 524 and 526, and I/O cells 514, 516, 518 and 520. Programmable interconnect matrix 502 may be centrally located, distributed throughout PLD 500 or comprise a non-programmable interconnect matrix. PLD 500 further includes I/O pins 506, 508, 510 and 512 which provide input signals to programmable interconnect matrix 502 and provide output signals from the I/O cells. I/O cells 514–520 support enabling and disabling functions associated with the normal operation of I/O pins 506–512. PLD 500 further shows configurable memory block 528 coupled to programmable interconnect matrix 502 and I/O cells 520. Configurable memory block 528 is a logic block which may be configured or programmed to function as any combination of a number of different memory types including, but not limited to, a first-in-first-out (FIFO) memory device, a last-in-first-out (LIFO) memory device, a single-port memory device and a multi-port memory device (e.g. a dual-port RAM). Additionally, configurable memory block 528 may function as a dedicated memory device such as a FIFO memory device, a LIFO memory device, or a multi-port memory device (e.g. dual-port RAM).

Configurable memory block 528 may comprise control logic and a memory storage element. The control logic may be programmable. In response to control signals received from programmable interconnect matrix 502, the control logic may substantially perform all logic functions required for configurable memory block 528 to selectively function as each of a plurality of memory devices. The control signals may be supplied externally from PLD 500 through dedicated input pins 504 and I/O pins 506–512, or the control signals may be internally generated within PLD 500 by logic blocks 522–526. It will be appreciated by one skilled in the art, that PLD 500 may comprise any number of logic blocks, I/O cells, dedicated input pins, or I/O pins. Additionally, the control logic may be entirely located within configurable memory block 528, or may be generated in part by other logic blocks such as logic blocks 522–526. In either case, configurable memory block 528 will implement the conventional functions of the memory device selected. For example, in contrast to the prior art, if a dual-port RAM or a FIFO memory device is selected by the control signals routed to configurable memory block 528, configurable memory block 528 will be capable of substantially performing a simultaneous read and write of data information. That is, address information and data information will not have to be shared or multiplexed by the storage element in configurable memory block 528, rather, configurable memory block 528 will comprise a dual-port storage element having separate ports for each group of address information and/or data information.

PLD 500 may also comprise a plurality of configurable memory blocks. Each of the configurable memory blocks may separately function as different memory types providing a significant increase in design flexibility available to a PLD user. Additionally, configurable memory blocks may be cascaded together to form memory devices having memory depths and widths of greater size than is possible in a single configurable memory block.

Figure 6:
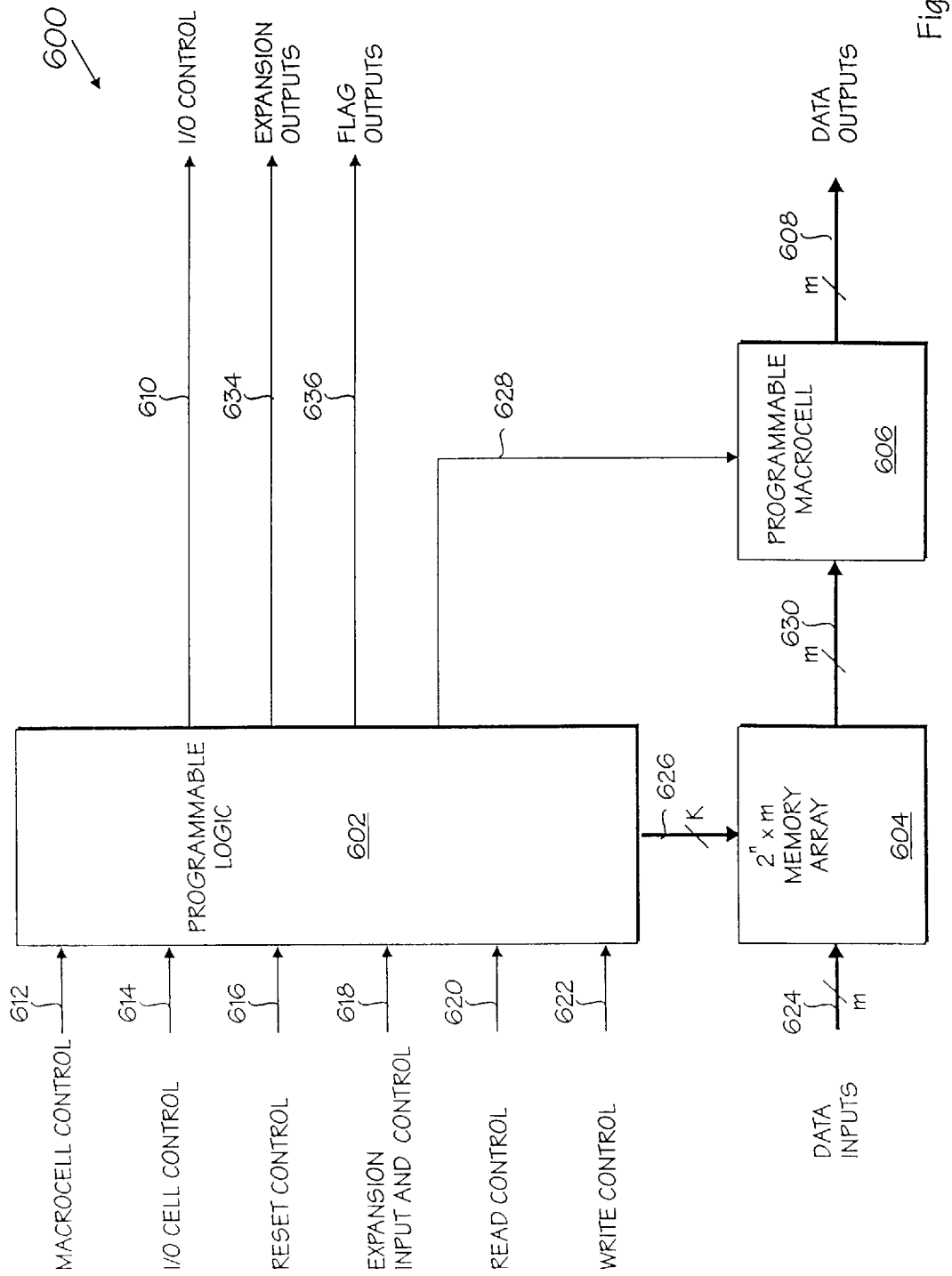
FIG. 6 illustrates one embodiment of a configurable memory block configured to operate as a FIFO or last-in-first-out (LIFO) memory device according to the present invention.

FIG. 6 illustrates one embodiment of the configurable memory block 528 implementing a dedicated FIFO memory device including, but not limited to, asynchronous FIFOs, synchronous FIFOs, serial FIFOs, parallel FIFOs, bi-directional FIFOs and various specialty FIFOs known in the art. It will be appreciated that FIG. 6 may also comprise a dedicated LIFO memory device with the appropriate changes made to programmable logic 602. The following description detailing the dedicated FIFO memory device applies equally to a LIFO device. FIG. 6 shows a FIFO logic block 600 comprising programmable logic 602 coupled to $2^n \times m$ memory array 604 and programmable macrocells 606. A number of control signals at nodes 612–622 are provided to programmable logic 602 from a programmable interconnect matrix (such as programmable interconnect matrix 502 illustrated in FIG. 5). The control signals may originate at dedicated input pins, I/O pins, or be generated by logic blocks within the PLD. As with conventional programmable logic in a logic block of a PLD, programmable logic 602 receives macrocell control signals at node 612 and I/O cell control signals at node 614, performs logic functions on these control signals and outputs programmable macrocell control signals at node 628 and I/O control signals at node 610 respectively.

Programmable logic 602 also receives FIFO control signals at nodes 616–622, namely: reset control at node 616, expansion input and control at node 618, read control at node 620 and write control at node 622. The expansion input and control signals may include, for example, expansion in, read expansion in, write expansion in, or first load signals. It will be appreciated that the FIFO control signals may not comprise expansion input and control signals when implementing non-expandable FIFO devices. Read control may comprise a single read enable signal, or multiple read control signals such as read enable signals and read clock signals. Similarly, write control may comprise a single write enable signal, or multiple write control signals such as write enable signals and write clock signals. It will also be appreciated that additional FIFO control signals may be received by programmable logic 602 including, but not limited to, clock inputs to operate FIFO logic block 600 in an asynchronous manner, retransmit control, serial input and serial output control, load control and various control signals associated with a bi-directional FIFO device which are known in the art (e.g. bypass control signals and strobe control signals).

Programmable logic 602 also generates and outputs FIFO output signals at nodes 634 and 636, namely expansion outputs at node 624, and flag outputs at node 636. Expansion outputs may include, for example, expansion out, or separate read expansion out and write expansion out signals. Flag outputs may include, for example, an empty flag, half-full flag, full-flag, or programmable flag outputs. It will also be appreciated that additional FIFO control signals may be generated and output by programmable logic 602 including, but not limited to, various output signals associated with a bi-directional FIFO device which are known in the art (e.g. bypass data signals). Additionally, the expansion and flag outputs may be provided to programmable macrocells, such as programmable macrocells 606 or another block of programmable macrocells included in FIFO logic block 600.

Programmable logic 602 receives the FIFO control signals and implements the control logic necessary to provide k bits of read and write information at node 626 to memory array 604. The k bits of read and write information may comprise n bits of read address information, n bits of write address information, r bits of write control information and/or s bits of read control information. M bits of data inputs are provided to memory array 604 at node 624. M bits of data are output from memory array 604 at node 630 and provided to programmable macrocells 606. The m bits of data at nodes 624 and/or 630 may comprise only one bit of data in a serial FIFO operation, or may comprise any number of parallel bits of information in a parallel FIFO operation. The data inputs are provided from a programmable interconnect matrix and may originate at dedicated input pins, I/O pins, or be generated by logic blocks within the PLD. Programmable macrocells 606 comprise logic elements such as multiplexers and register elements which may be utilized to further output m bits of data as data outputs at node 608.

FIFO logic block 600 is capable of substantially performing a simultaneous read and write of data information. That is, address information and data information will not have to be shared or multiplexed by memory array 604, rather, memory array 604 comprises a dual-port memory array having separate ports for writing data into memory array 604 and for reading data from memory array 604. Programmable logic 602 implements the necessary write control logic and provides write pointer address information for writing m bits of data inputs to memory array 604. Similarly, programmable logic 602 implements the necessary read control logic and provides read pointer address information for reading m bits of data from memory array 604.

Figure 7:
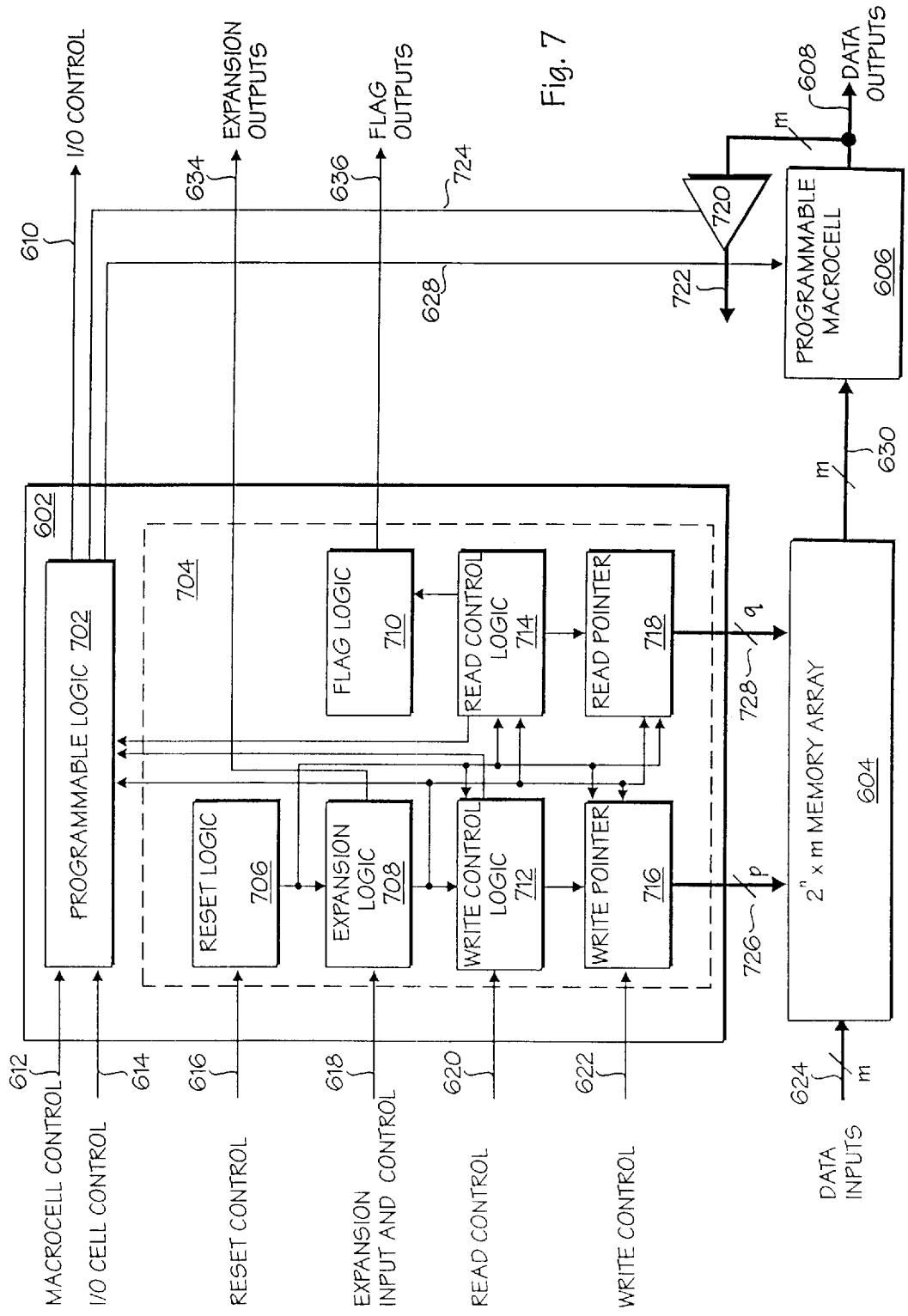
FIG. 7 illustrates another embodiment of a configurable memory block configured to operate as a FIFO memory device according to the present invention.

FIG. 7 illustrates one embodiment of programmable logic 602 which may be employed to implement the necessary FIFO control logic for FIFO logic block 600. Programmable logic 602 includes programmable logic 702 coupled to FIFO control logic 704. Programmable logic 702 receives the macrocell control signals at node 612 and the I/O cell control signals at node 614. Programmable logic 702 also generates I/O control signals at node 610, provides tri-state control signals at node 724 to control tri-state buffers 720, and provides programmable macrocell control signals at node 628. FIFO control logic 704 includes a number of blocks of logic, namely: reset logic 706 coupled to reset control at node 616; expansion logic 708 coupled to reset logic 706 and expansion input and control at node 618; write control logic 712 coupled to reset logic 706, expansion logic 708 and write control at node 622; write pointer 716 coupled to reset logic 706, expansion logic 708 and write control logic 712; read control logic 714 coupled to reset logic 706, expansion logic 708 and read control at node 620; flag logic 710 coupled to reset logic 706, read control logic 714 and write control logic 712; and read pointer 718 coupled to reset logic 706, expansion logic 708 and read control logic 714. Programmable logic 702 is coupled to expansion logic 708, read control logic 714, write control logic 712, write pointer 716 and read pointer 718. Additionally, expansion logic 708 outputs expansion outputs at node 624, and flag logic 710 outputs flag outputs at node 626.

It will be appreciated that control logic 704 comprises the control logic necessary to implement a conventional asynchronous FIFO. In general, reset logic 706 resets the elements 708–718 to a known state in response to reset control signals. Write control logic 712 receives write control signals and operates in conjunction with write pointer 716 to provide p bits of write information to memory array 604 at node 726. The p bits of write information may comprise r bits of write control signals and n bits of write address information. M bits of data inputs at node 624 may then be written to memory array 604 at the address provided by write pointer 716. Data may be simultaneously read from memory array 604 in a similar manner. Read control logic 714 receives read control signals and operates in conjunction with read pointer 718 to provide q bits of read information to memory array 604 at node 728. The q bits of read information may comprise s bits of read control signals and n bits of read address information. M bits of data information may then be read out from memory array 604 at node 630 and provided to programmable macrocells 606. Programmable macrocells 606 further provide m bits of data as data outputs at node 608 which is also provided to tri-state buffers 720. Tri-state buffers 720 may provide the data outputs at node 608 back to the programmable interconnect matrix at node 722 in response to the control signals at node 724. It will be appreciated that tri-state buffers 720 represent one tri-state buffer for each bit of the m bits provided at node 608. Each tri-state buffer may be coupled to its own control signal at node 724, or a plurality of tri-state buffers may share a control signal. The logic utilized in programmable logic 702 to generate the tri-state control signals at node 724 may comprise the same logic used to generate control signals (I/O control) for tri-state buffers utilized in I/O cells. Additionally, the control signals at node 724 may be provided directly from a programmable interconnect matrix. It will be appreciated that any other type of FIFO or LIFO memory device may be implemented within control logic 704 within the spirit and scope of the present invention.

Figure 8:
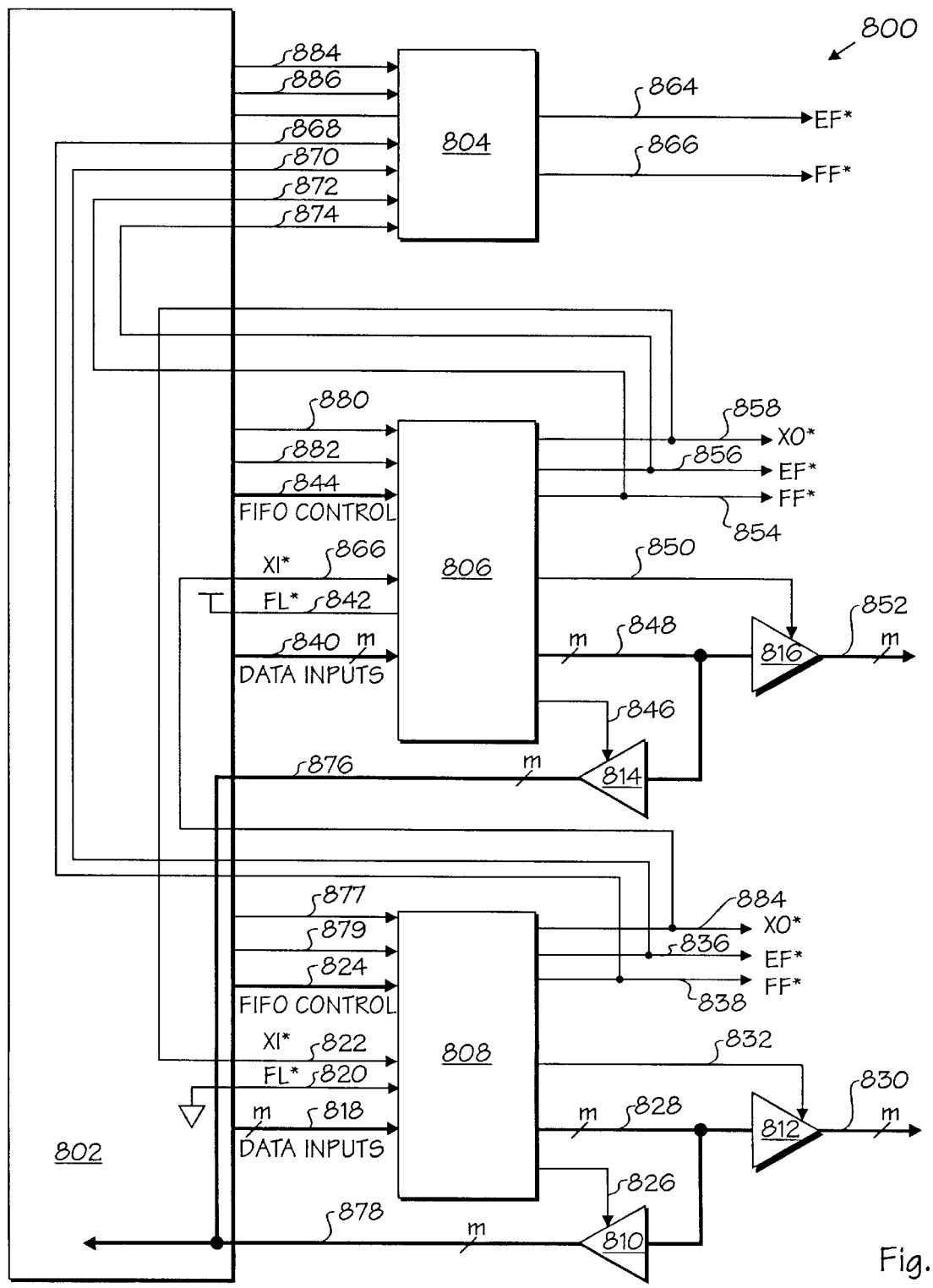
FIG. 8 illustrates one embodiment for expanding the memory depth of configurable memory blocks comprising FIFO memory devices according to the present invention.

FIG. 8 illustrates a PLD 800 having multiple logic blocks configured as FIFO memory devices cascaded in depth expansion. PLD 800 includes a programmable interconnect matrix 802 coupled to FIFO logic blocks 806 and 808 and logic block 804. FIFO logic blocks 806 and 808 comprise FIFO logic blocks such as FIFO logic block 600 illustrated in FIG. 6. FIFO logic blocks 806 and 808 may comprise memory arrays with different storage depths. FIFO logic blocks 806 and 808 are cascaded together to provide a FIFO memory device having a depth which comprises the aggregate depths of FIFO logic blocks 806 and 808.

PLD 800 cascades FIFO logic blocks 806 and 808 using expansion in (XI*) input signals interconnected with expansion out (XO*) output signals. The expansion out signals of each of the FIFO logic blocks 806 and 808 are coupled to the expansion in inputs of the other FIFO logic block. FIFO logic blocks 806 and 808 receive FIFO control signals at nodes 844 and 824 respectively from programmable interconnect matrix 802. The FIFO control signals comprise, for example, the FIFO control signals at nodes 616–622 illustrated in FIGS. 6–7. FIFO logic blocks 806 and 808 also receive macrocell control signals at nodes 880 and 877, and I/O control signals at nodes 882 and 879. The FIFO control signals at nodes 844 and 824 may be provided by a common bus from inside of programmable interconnect matrix 802, or may be generated separately.

FIFO logic blocks 806 and 808 also receive data inputs at nodes 840 and 818 respectively from programmable interconnect matrix 802. The data inputs at nodes 840 and 818 may be provided by a common bus from inside of programmable interconnect 802, or may be generated separately. FIFO logic block 808 further receives first load FL* at node 820 which is coupled to a low logic level, such as a ground source, by programmable interconnect matrix 802. With FL* coupled to a low logic level, data will be written to and read from FIFO logic block 808 before it is written to and read from FIFO logic block 806. FIFO logic block 808 outputs XO* at node 834 which is coupled to XI* at node 866 of FIFO logic block 806 via programmable interconnect matrix 802. FIFO logic block 806 also has a first load FL* input at node 842. FL* at node 842 is coupled to a high logic level, such as a power source, to indicate that data will be written to and read from FIFO logic block 806 after it is written to and read from FIFO logic block 808. FIFO logic block 806 outputs XO* at node 858 which is coupled to XI* at node 822 via programmable interconnect matrix 802.

FIFO logic blocks 806 and 808 also output empty flag EF* outputs at nodes 856 and 836 respectively, and full flag FF* outputs at nodes 854 and 838 respectively. The empty flag outputs at nodes 856 and 836 are routed to input nodes 874 and 870 respectively of logic block 804 via programmable interconnect matrix 802. Logic block 804 is programmed to generate a composite empty flag for FIFO logic blocks 806 and 808 at node 864. For example, logic block 804 may perform a logical OR function on the signals received at nodes 870 and 874, such that the signal output at node 864 will only comprise a low logic level when FIFO logic blocks 806 and 808 are empty and assert low logic levels at nodes 856 and 836 respectively. In a similar manner, the full flag outputs at nodes 854 and 838 are routed to input nodes 872 and 868 respectively of logic block 804 via programmable interconnect matrix 802. Logic block 804 is programmed to generate a composite full flag for FIFO logic blocks 806 and 808 at node 866. For example, logic block 804 may perform a logical OR function on the signals received at nodes 872 and 868 such that the signal output at node 866 will only comprise a low logic level when FIFO logic block 806 and 808 are full and assert low logic levels at nodes 854 and 838 respectively. A similar technique may be utilized to generate other composite flag outputs including half-full flag outputs and programmable flag outputs.

Data is read from FIFO logic blocks 806 and 808 and output to nodes 848 and 828 respectively. Given that FIFO logic blocks 806 and 808 are coupled in depth expansion, the data outputs at nodes 848 and 828 must be coupled together to form one data bus. PLD 800 illustrates two methods of providing a common data output bus. The first method employs tri-state buffers 816 and 812 controlled by tri-state control signals 850 and 832 respectively. Each of the tri-state buffers 816 and 812 represent one tri-state buffer for each of m bits of data output at nodes 848 and 828 respectively. When data is read from FIFO logic block 808 and output at node 828, the tri-state control signal at node 832 provided by programmable logic within FIFO logic block 808 enables tri-state buffer 812 to pass output data to node 830. In order to avoid data contention issues, the tri-state control signal at node 850 disables tri-state buffer 816 so that data is not provided to node 852. Nodes 852 and 830 are coupled together either within PLD 800 to common I/O pins, or are coupled external to PLD 800. In like manner, when data is read from FIFO logic block 806 and output at node 848, the tri-state control signal at node 850 provided by programmable logic within FIFO logic block 806 enables tri-state buffer 816 to pass output data to node 852. In order to avoid data contention issues, the tri-state control signal at node 832 disables tri-state buffer 812 so that data is not provided to node 830. Tri-state buffers 816 and 812 may be included within I/O cells provided in PLD 800.

A second method of providing a common data output bus is also illustrated in FIG. 8 utilizing tri-state buffers 814 and 810 controlled by tri-state control signals 846 and 826 respectively. Each of the tri-state buffers 814 and 810 represent one tri-state buffer for each of the m bits of data output at nodes 848 and 828 respectively. When data is read from FIFO logic block 808 and output at node 828, a tri-state control signal at node 826 provided by programmable logic within FIFO logic block 808 enables tri-state buffer 810 to pass the data output to node 878. In order to avoid data contention issues, the tri-state control signal at node 846 disables tri-state buffer 814 so that data is not provided to node 876. Nodes 876 and 878 are coupled together within programmable interconnect matrix 802 and are provided for further use to other logic blocks within PLD 800. In like manner, when data is read from FIFO logic block 806 and output at node 848, the tri-state control signal at node 846 provided by programmable logic within FIFO logic block 806 enables tri-state buffer 814 to pass output data to node 876. In order to avoid data contention issues, the tri-state control signal at node 826 disables tri-state buffer 810 so that data is not provided to node 878.

It will be appreciated that a FIFO logic block, such as FIFO logic block 600 illustrated in FIG. 6, may be expanded in width as well. Thus, a plurality of FIFO logic blocks comprising the same or different memory widths, may be cascaded together to form a FIFO memory device having a memory width comprising the aggregated width of the individual FIFO logic blocks. Each FIFO logic block would receive FIFO control signals provided by a programmable interconnect matrix, and would generate flag outputs. The flag outputs may be routed to a logic block as illustrated in FIG. 8, to generate composite flags. Furthermore, multiple FIFO logic blocks may be cascaded together to increase both memory depth and memory width over that of each individual FIFO logic block. Additionally, FIFO logic blocks may be controlled to act as more than one FIFO logic block in response to control signal inputs.

Figure 9:
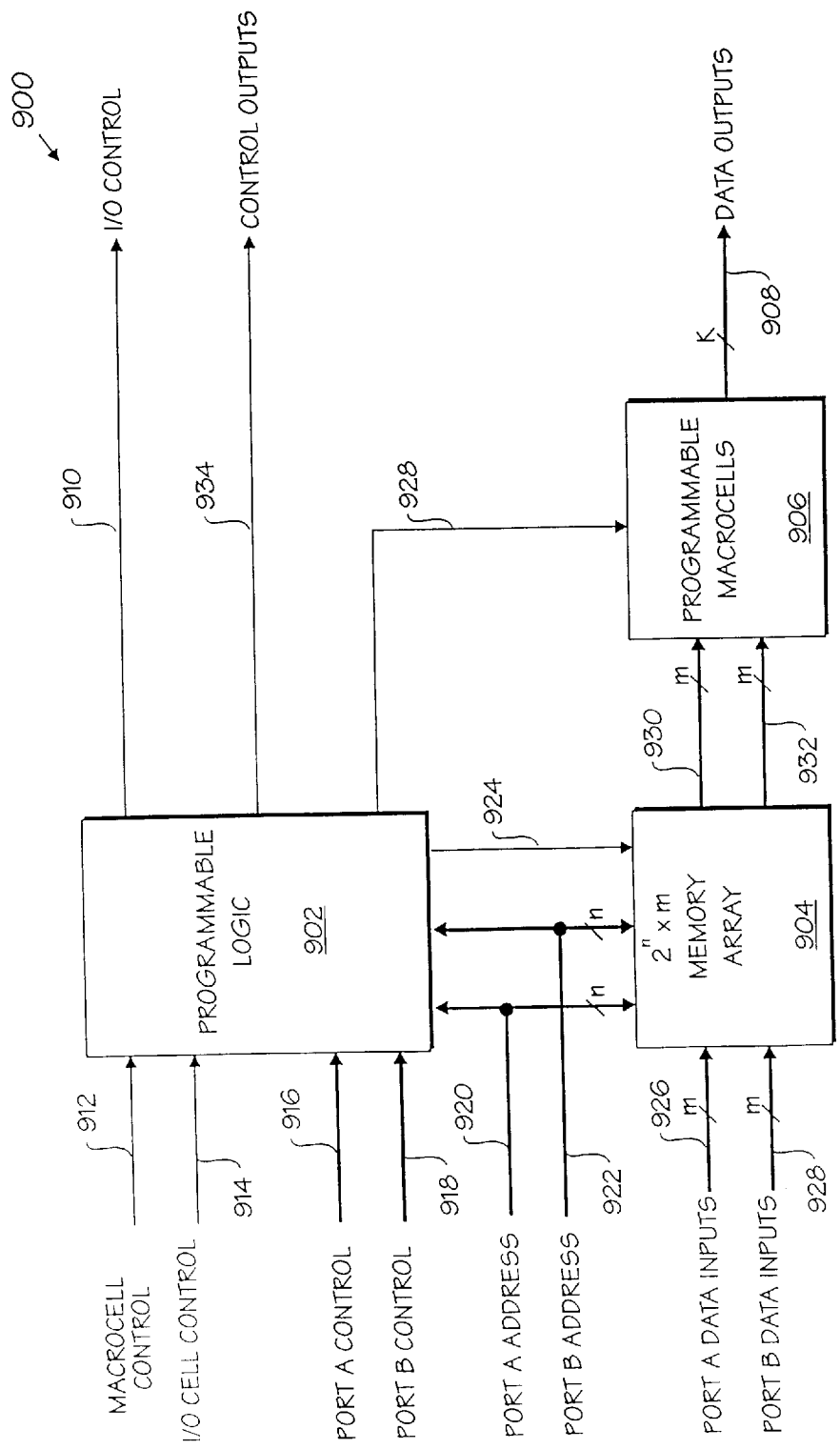
FIG. 9 illustrates one embodiment of a configurable memory block configured to function as a dual-port memory device according to the present invention.

FIG. 9 illustrates one embodiment of the configurable memory block 528 illustrated in FIG. 5 implementing a dedicated dual-port memory device. It will be appreciated that the embodiment illustrated in FIG. 9 may be extended to a multi-port memory device having any number of ports. FIG. 9 shows dual-port logic block 900 having two ports, port A and port B, permitting independent, asynchronous access for reads and writes to any location in memory array 904. Dual-port logic block 900 comprises programmable logic 902 coupled to $2^n \times m$ memory array 904 and programmable macrocells 906. As with conventional programmable logic in a logic block of a PLD, programmable logic 902 receives macrocell control signals at node 912 and I/O cell control signals at node 914, performs logic functions on these control signals and outputs programmable macrocell control signals at node 928 and I/O control signals at node 910.

Programmable logic 902 receives port A control signals at node 916 and port A address signals at node 920. Additionally, programmable logic 902 receives port B control signals at node 918 and port B address signals at node 922. The address signals and the control signals are provided by a programmable interconnect matrix. The control signals and address signals may originate at dedicated input pins, I/O pins, or be generated by logic blocks within the PLD. The port A and port B control signals may each include, for example, a read/write signal, a busy signal, an output enable signal, a chip select signal, a lower byte signal, an upper byte signal, a clock signal, a read/write lower byte signal, and/or a read/write upper byte signal. Programmable logic 902 comprises the control logic necessary to perform row and column decoding of port A and port B address information received at nodes 920 and 922, respectively. Memory array 904 also receives port A address signals and node 920 and port B address at node 922 signals. Row and column decode functions may be performed within memory array 904 itself.

Programmable logic 902 also performs the necessary arbitration function required when port A and port B access the same shared memory location in memory array 904. Programmable logic 902 communicates arbitration information, as well as other read and write control information, to memory array 904 at node 924. Programmable logic 902 also generates and outputs control outputs at node 934. Control outputs may include semaphore outputs, interrupt outputs, and/or busy outputs. Additionally, the control outputs may be provided to programmable macrocells, such as programmable macrocells 906 or another block of programmable macrocells included in dual-port logic block 900.

Programmable logic 902 receives the dual-port memory control signals and implements the control logic necessary to provide n bits of port A address information and n bits of port B address information to memory array 904. M bits of port A data inputs are provided to memory array 904 at node 926, and m bits of port B data inputs are provided to memory array 904 at node 928. The m bits of data may comprise only one bit of data, or may comprise any number of bits of data information. The data inputs for port A and port B are provided from a programmable interconnect matrix and may originate at dedicated input pins, I/O pins, or be generated by logic blocks within the PLD. The m bits of port A data are read from memory array 904 and output at node 930 to programmable macrocells 906. Similarly, the m bits of port B data are read from memory array 904 and output at node 932 to programmable macrocells 906. Alternatively, dual-port logic block 900 may include a multiplexing device which receives the port A data output at node 930 and the port B data output at node 932 and selectively provides one of these groups of output data to programmable macrocells 906. The multiplexing device may receive a control signal which controls which group of output data is provided to programmable macrocells 906. The control signal may be provided by programmable logic 902 or from a programmable interconnect matrix. Programmable macrocells 906 comprise logic elements such as multiplexers and register elements which may be utilized to further output k bits of data as data outputs at node 908, wherein k may comprise m, 2m, or any number of required bits.

Dual-port logic block 900 is capable of substantially performing a simultaneous read and write of data information with respect to memory array 904. That is, address information and data information will not have to be shared or multiplexed by memory array 904. Memory array 904 comprises a dual-port memory array having an A port and a B port. Both ports operative substantially independently from each other such that data may be written to both ports simultaneously, read from both ports simultaneously, or read and/or written from each port substantially simultaneously. Arbitration logic in programmable logic 902 will prevent the simultaneous write to the same memory location in memory array 904. Programmable logic 902 implements the necessary write and read control logic and associated column and row decoders for each of ports A and B. Alternatively, row and column decode functions may be performed within memory array 905 itself.

Figure 10:
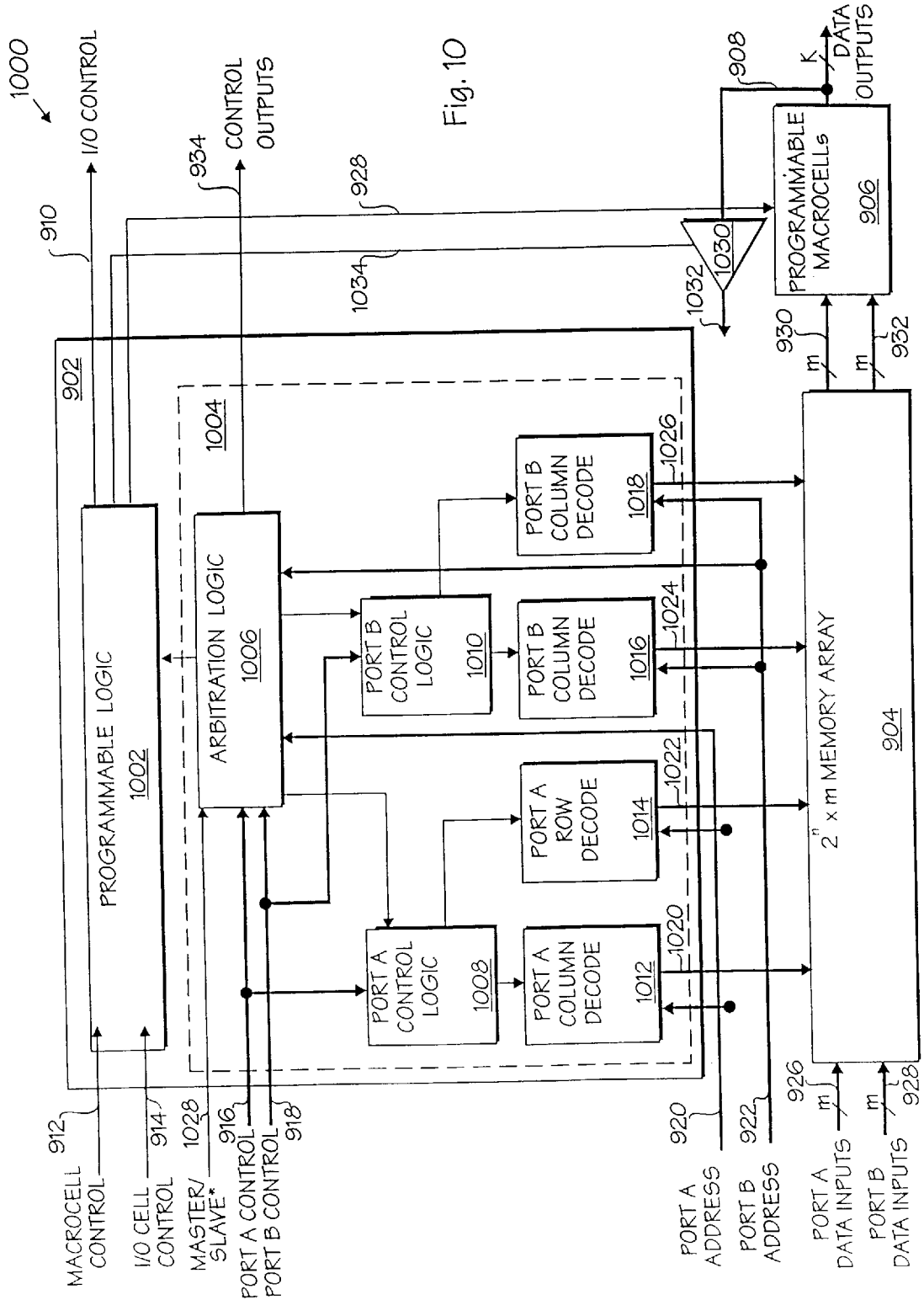
FIG. 10 illustrates another embodiment of a configurable memory block configured to function as a dual-port memory device according to the present invention.

FIG. 10 illustrates one embodiment of programmable logic 902 which may be employed to implement the necessary dual-port control logic for dual-port logic block 900. Programmable logic 902 includes programmable logic 1002 coupled to dual-port control logic 1004. Programmable logic 1002 receives the macrocell control signals at node 912 and the I/O cell control signals at node 914. Programmable logic 1002 also generates I/O control signals at node 910, provides tri-state control signals at node 1034 to control tri-state buffers 1030, and provides control signals to programmable macrocells 906 at node 928. Tri-state buffers 1030 may provide the data outputs at node 908 back to the programmable interconnect matrix at node 1032 in response to the control signals at node 1034. It will be appreciated that tri-state buffers 1030 represent one tri-state buffer for each bit of the k bits provided at node 908. Each tri-state buffer may be coupled to a separate control signal, or a plurality of tri-state buffers may share a single control signal. The logic utilized in programmable logic 902 to generate the tri-state control signals at node 1034 may comprise the same logic used to generate control signals (I/O control) for tri-state buffers utilized in I/O cells. Additionally, the control signals at node 1034 may be provided directly from a programmable interconnect matrix.

Dual-port control logic 1004 comprises the control logic necessary to implement a conventional dual-port memory device. Dual-port control logic 1004 includes arbitration logic 1006 receiving a Master/Slave* control signal at node 1028, port A control signals at node 916, port B control signals at node 918, port A address signals at node 920 and port B address signals at node 922. Arbitration logic 1006 is also coupled to port A control logic 1008 and port B control logic 1010. Arbitration logic 1006 arbitrates access to shared memory array 904 and may inhibit access of port A or port B to a particular memory location in memory array 904. Arbitration logic 100 also provides control signals at node 934 including semaphore outputs, interrupt outputs, or busy outputs.

Dual-port control logic 1004 also comprises port A control logic 1008 and port B control logic 1010. Port A control logic 1004 is coupled to the port A control signals at node 916, port A row decode 1014 and port A column decode 1012. Port B control logic 1010 is coupled to the port B control signals at node 918, port B row decode 1018 and port B column decode 1016. Additionally, port A column decode 1012 and port A row decode 1014 are coupled to port A address at node 920, and provide n bits of port A column and row address signals to memory array 904 at nodes 1020 and 1022 respectively. Port A column decode 1012 and port A row decode 1014 may also provide r bits of port A control signals to memory array 904 at nodes 1020 and 1022 respectively. Port A control signals may comprise write, read, or arbitration control signals. In a similar manner, port B column decode 1016 and port B row decode 1018 are coupled to port B address at node 922, and provide n bits of port B column and row address signals to memory array 904 at nodes 1024 and 1026 respectively. Additionally, port B column decode 1016 and port B row decode 1018 may provide s bits of port B control signals to memory array 904 at nodes 1020 and 1022 respectively. Port B control signals may comprise write, read, or arbitration signals. It will be appreciated that other conventional dual-port or multi-port memory control logic may be implemented within dual-port control logic 1004 within the spirit and scope of the present invention.

A PLD may comprise more than one multi-port logic block each comprising the same or different memory widths or depths. The multi-port logic blocks may then be cascaded together to form a multi-port device having a memory depth or width which comprises the aggregate of the individual memory widths and depths of each of the multi-port logic blocks. A Master/Slave* input signal may be used for width expansion of the multi-port logic blocks in a PLD. For example, in the embodiment of dual-port logic block 1000 illustrated in FIG. 10, dual-port logic block 1000 operates as a single dual-port memory device when the Master/Slave* signal at node 1028 comprises a high logic level. In this embodiment, port A control signals and port B control signals do not include busy input signals. When two or more of dual-port logic blocks 1000 are coupled together to increase the memory depth of an available dual-port memory device in a PLD, the Master/Slave* input for each dual-port logic block comprises a high logic level, and each of the port A and port B control signals include a chip enable signal. The chip enable signals are utilized to indicate which of the respective dual-port logic blocks is accessed at a given time. The other port A and port B control signals, the port A and port B address signals and the port A and port B data inputs for each dual-port logic block may be shared or provided independently from a programmable interconnect matrix. Additionally, as was described with respect to FIFO depth expansion illustrated in FIG. 8, tri-state buffers, such as tri-state buffer 1030, may be utilized to provide data outputs to a programmable interconnect matrix where they are coupled together and may be routed for use by other logic blocks in the PLD. Alternatively, tri-state buffers within I/O cells may be utilized to control the output of data to I/O pins, such that data output from each of the dual-port logic blocks cascaded together may be coupled with the PLD or external to the PLD without encountering data contention issues.

In one embodiment of memory width expansion utilizing the dual-port logic block illustrated in FIG. 10, the Master/Slave* signal on one of the dual-port logic blocks comprises a high logic level indicating a master device. The Master/Slave* signal on each of the other dual-port logic blocks comprises a low logic level indicating that these dual-port logic blocks comprise slave devices. In this configuration, arbitration logic 1006 is utilized only in the master device. Therefore, arbitration logic 1006 of the master dual-port logic block outputs a busy output signal for each of port A and port B. The busy output signals are then routed to busy input signals (of port A and port B control signals) to each of the slave dual-port logic blocks via a programmable interconnect matrix. It will be appreciated, however, that it is within the scope of the present invention that arbitration may be performed in the master and slave dual-port logic blocks.

Figure 11:
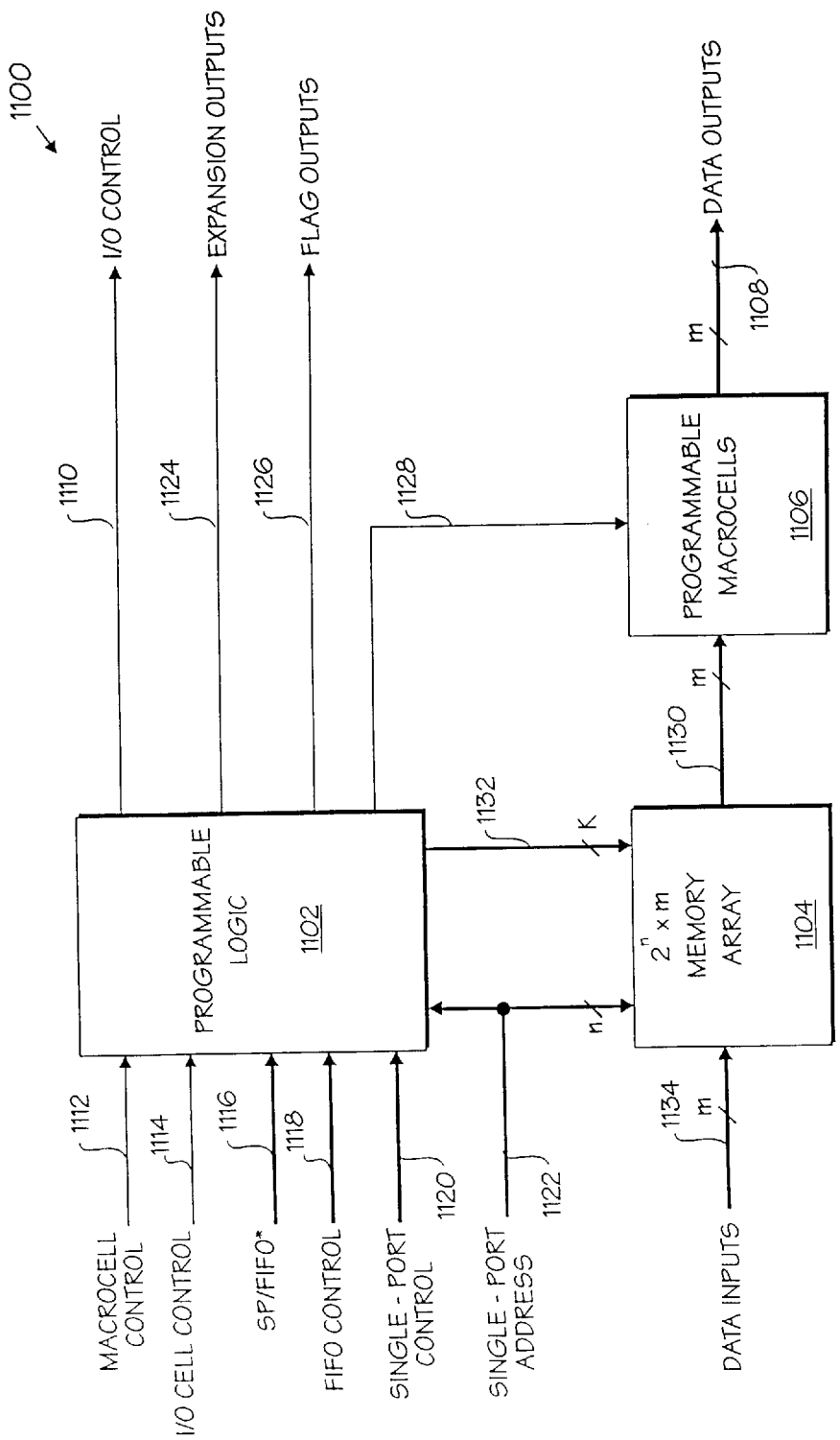
FIG. 11 illustrates one embodiment of a configurable memory block configured to function as either a FIFO or a single-port memory device according to the present invention.

FIG. 11 illustrates one embodiment of the configurable memory block 528 illustrated in FIG. 5 implementing a single-port/FIFO (or single-port/LIFO) memory device. FIG. 11 shows a single-port/FIFO logic block 1100 comprising programmable logic 1102 coupled to $2^n \times m$ memory array 1104 and programmable macrocells 1106. Single-port/FIFO logic block 1100 is configurable to implement either a single-port memory device (e.g. single-port SRAM) with separate I/O, or a FIFO device. It will be appreciated that single-port/FIFO logic block 1100 may alternatively comprise a single-port/LIFO device configurable to implement either a single-port memory device with separate I/O, or a LIFO device. As with conventional programmable logic in a logic block of a PLD, programmable logic 1102 receives macrocell control signals at node 1112 and I/O cell control signals at node 1114, performs logic functions on these signals and outputs programmable macrocell control signals at node 1128 and I/O control signals at node 1110. Programmable logic 1102 is coupled to FIFO control signals at node 1118 and outputs FIFO expansion outputs at node 1124 and flag outputs at node 1126. The FIFO control signals, expansion outputs and flag outputs comprise, for example, the FIFO control signals, expansion outputs and flag outputs described with respect to FIFO logic block 600 illustrated in FIG. 6. Additionally, the expansion and flag outputs may be provided to programmable macrocells, such as programmable macrocells 1106 or another block of programmable macrocells included in single-port/FIFO logic block 1100. Programmable logic 1102 additionally receives single-port control signals at node 1120. Single-port control signals may include chip-enable signals, write enable signals, or output enable signals.

Programmable logic 1102 further is coupled to a SP/FIFO* signal at node 1116 which selectively indicates whether single-port/FIFO logic block 1100 will operate as a single-port memory device or as a FIFO memory device. When SP/FIFO* comprises a high logic level, single-port/FIFO logic block 1100 operates as a single-port memory device. When SP/FIFO* comprises a low logic level, single-port/FIFO logic block 1100 operates as a FIFO memory device. SP/FIFO* may comprise a programmable configuration bit, be generated by a logic block with in the PLD, or be generated external to the PLD. When single-port/FIFO logic block 1100 operates as a FIFO memory device, it is capable of substantially performing a simultaneous read and write of data information in a similar manner as FIFO logic block 600 illustrated in FIG. 6. That is, data and/or address information need not be shared or multiplexed when writing or reading from memory array 1104.

Programmable logic 1102 and memory array 1104 are coupled to the single-port address at node 1122. Programmable logic 1102 also receives the FIFO and single-port control signals and, in one embodiment, may implement the control logic necessary to provide memory array 1104 with n bits of single-port address information. Programmable logic 1102 also provides k bits of FIFO read and write information at node 1132. The k bits of read and write information may comprise n bits of read address information and/or n bits of write address information. The k bits of read and write information may also comprise read and write control information or other control information which indicates what memory array 1104 should do with the single-port address at node 1122 (including disregarding it altogether). M bits of data are output from memory array 1104 at node 1130 and provided to programmable macrocells 1106. The m bits of data at nodes 1134 and/or 1130 may comprise only one bit of data in a serial FIFO or one-bit wide single-port memory device, or may comprise any number of parallel bits of information. The data inputs are provided from a programmable interconnect matrix and may originate at dedicated input pins, I/O pins, or be generated by logic blocks with the PLD. Programmable macrocells 1106 comprise logic elements such as multiplexers and register elements which may be utilized to further output m bits of data as data outputs at node 1108. Additionally, a PLD may include more than one single-port/FIFO logic block in order to implement memory width and depth expansion.

Figure 12:
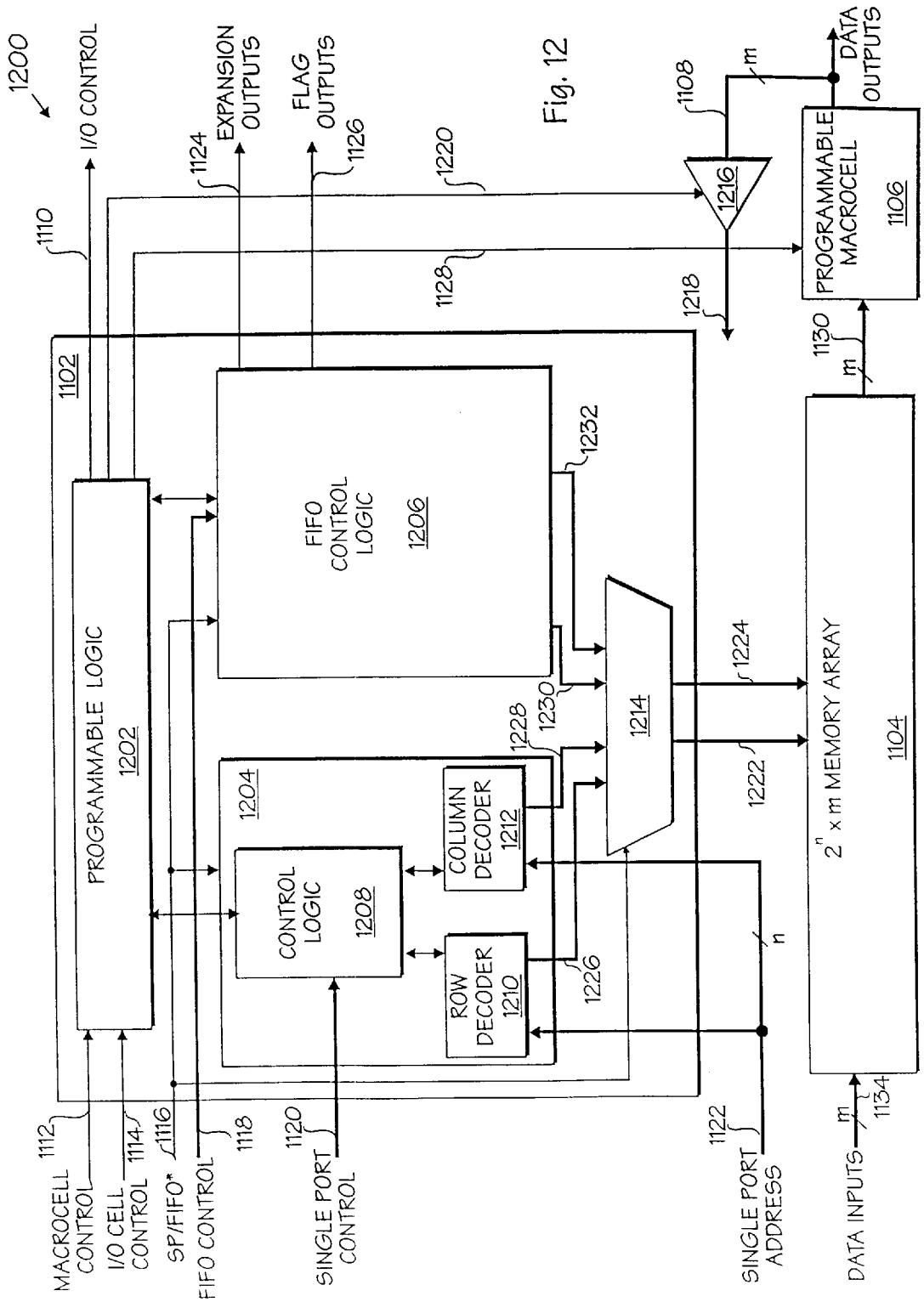
FIG. 12 illustrates another embodiment of a configurable memory block configured to function as either a FIFO or a single-port memory device according to the present invention.

FIG. 12 illustrates SRAM/FIFO logic block 1200 comprising one embodiment of programmable logic 1102 configured to implement either an SRAM or a FIFO memory device. Programmable logic 1102 includes programmable logic 1202 coupled to FIFO control logic 1206 and SRAM control logic 1204. Data outputs at node 1108 are coupled to tri-state buffers 1216 and may be provided back to a programmable interconnect matrix at node 1218 in response to tri-state control signals provided by programmable logic 1202 at node 1220 (or directly from a programmable interconnect matrix). Each tri-state buffer may be coupled to its own control signal or a plurality of tri-state buffers may share a single-control signal. FIFO control logic 1206 comprises control logic for implementing a FIFO function together with memory array 1104, and couples write and read pointer information to multiplexer 1214 at nodes 1230 and 1232. FIFO control logic 1206 may comprise, in one embodiment, the FIFO control logic 704 illustrated in FIG. 7. SRAM control logic 1204 provides the necessary control logic in order to implement an SRAM function together with memory array 1104. In one embodiment, as illustrated in FIG. 12, SRAM control logic 1204 comprises control logic 1208 coupled to the single-port control signals at node 1120. Additionally, control logic 1208 is coupled to row decoder 1210 and column decoder 1212. Row decoder 1210 and column decoder 1212 are coupled to the single-port address at node 1122. In response to the single-port control signals received by control logic 1208, control logic 1208 will enable row decoder 1210 and column decoder 1212 to provide row and address information at nodes 1226 and 1228 respectively to multiplexer 1214.

As previously described, SP/FIFO* selectively controls whether SRAM/FIFO logic block 1200 will function as an SRAM memory device or a FIFO memory device. SP/FIFO* at node 1116 is coupled to multiplexer 1214 and selectively controls whether the row and column address information at nodes 1226 and 1228 or the read and write pointer information at nodes 1230 and 1232 is provided to memory array 1104 at nodes 1222 and 1224. When SP/FIFO* comprises a high logic level, multiplexer 1214 provides SRAM row and address information to nodes 1222 and 1224. When SP/FIFO* comprises a low logic level, multiplexer 1214 provides FIFO read and write pointer information to nodes 1222 and 1224.

In an alternative embodiment, the FIFO control signals at node 1118 and the single-port control signals at node 1120, may be shared in order to reduce the number of signals required for SRAM/FIFO logic block 1200. In one embodiment, a FIFO read control signal and an SRAM chip enable signal may share the same signal. This signal is coupled to read control logic in FIFO control logic 1206, and is coupled to control logic 1208 of SRAM control logic 1204. When SP/FIFO* comprises a high logic level, this signal functions as a chip enable for control logic 1208. Similarly, when SP/FIFO* comprises a low logic level, this signal functions as a read enable signal for FIFO control logic 1206. Similarly, a FIFO write control signal and an SRAM write enable signal may share the same signal. This signal is coupled to write control logic in FIFO control logic 1206, and coupled to control logic 1208 of SRAM control logic 1204. When SP/FIFO* comprises a high logic level, this signal functions as a write enable for control logic 1208. Similarly, when SP/FIFO* comprises a low logic level, this signal functions as a write enable signal for FIFO control logic 1206.

In another embodiment of SRAM/FIFO logic block 1200, the single-port address signals at node 1122 may be utilized by FIFO control logic 1206. It will be appreciated that when SP/FIFO* comprises a low logic level indicating that SRAM/FIFO logic block 1200 will operate as a FIFO memory device, the single-port address signals are not being used by SRAM control logic 1204 of SRAM/FIFO block 1200. Therefore, these signals may alternatively be coupled to FIFO control logic 1206 and used as FIFO control signals. Thus, in one embodiment, one of the n bits of single-port address signals may be used as a reset control signal and coupled to reset control logic in FIFO control logic 1206. In another embodiment, another single-port address signal may be used as an expansion input signal (e.g. XI* or FL*).

In the single-port/FIFO logic embodiments described with respect to FIGS. 11 and 12, a PLD may incorporate more than one single-port/FIFO logic block and expand the memory depth and width available. When the FIFO operation is selected, FIFO depth expansion may also be implemented as illustrated in FIG. 8. FIFO width expansion may be implement as previously described with respect to FIGS. 6–8. When the single-port operation is selected, memory depth may be expanded as generally described in regards to multi-port depth expansion. That is, by controlling the chip enable control signals provided to the respective single-port/ FIFO logic blocks, and coupling the data outputs together either within a programmable interconnect matrix, in the I/O cells, or external to the PLD. Single-port width expansion may be implemented by simply simultaneously enabling the more than one single-port/FIFO logic blocks.

Figure 13:
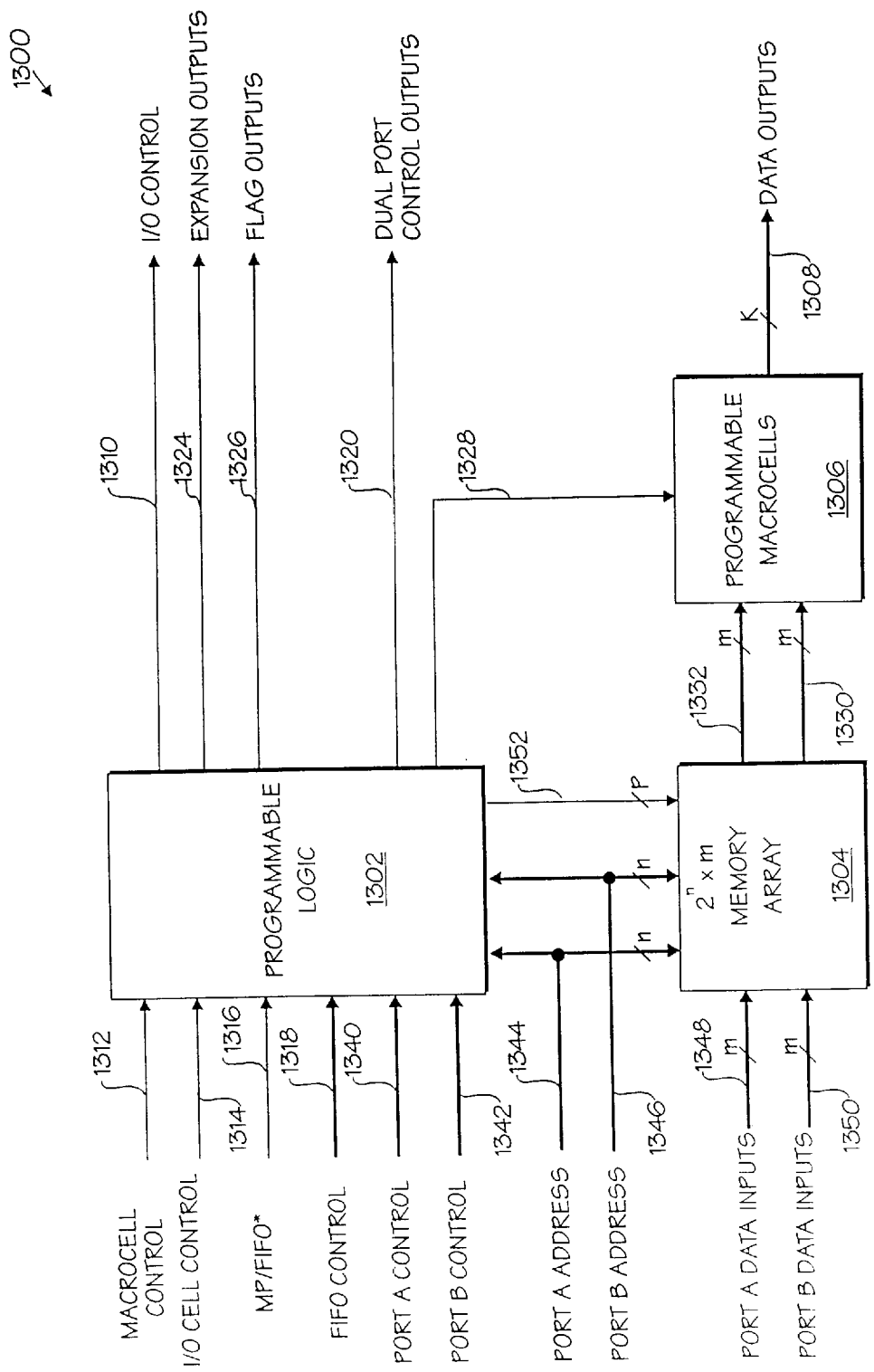
FIG. 13 illustrates one embodiment of a configurable memory block configured to function as either a FIFO or a dual-port memory device according to the present invention.

FIG. 13 illustrates one embodiment of the configurable memory block 528 illustrated in FIG. 5 implementing a multi-port/FIFO (or multi-port/LIFO) memory device. FIG. 13 shows a dual-port/FIFO logic block 1300 comprising programmable logic 1302 coupled to $2^n \times m$ memory array 1304 and programmable macrocells 1306. Dual-port/FIFO logic block 1300 is configurable to implement either a dual-port memory device (e.g. dual-port RAM), or a FIFO device. It will be appreciated that dual-port/FIFO logic block 1300 may alternatively comprise a dual-port/LIFO logic block configurable to implement either a dual-port memory device or a LIFO device. It will also be appreciated that dual-port/FIFO logic block 1300 may be extended to a multi-port/FIFO logic block by providing more access ports to programmable logic 1302 and memory array 1304. As with conventional programmable logic in a logic block of a PLD, programmable logic 1302 receives macrocell control signals at node 1312 and I/O cell control signals at node 1314, performs logic functions on these signals and outputs programmable macrocell control signals at node 1328 and I/O control signals at node 1310. Programmable logic 1302 is coupled to FIFO control signals at node 1318 and outputs FIFO expansion outputs at node 1324 and flag outputs at node 1326. The FIFO control signals, expansion outputs and flag outputs comprise, for example, the FIFO control signals, expansion outputs and flag outputs described with respect to FIFO logic block 600 illustrated in FIG. 6. Programmable logic 1302 additionally receives dual-port control signals comprising port A control signals at node 1340 and port B control signals at node 1342. Dual-port control signals may include, for example, the port A and port B control signals described with respect to multi-port logic block 900 illustrated in FIG. 9. In a similar manner, programmable logic 1302 outputs dual-port control outputs at node 1320 which may comprise, for example, the dual-port control outputs described with respect to multi-port logic block 900 illustrated in FIG. 9. Additionally, the expansion, flag and dual-port outputs may be provided to programmable macrocells, such as programmable macrocells 1306 or another block of programmable macrocells included in dual-port/FIFO logic block 1300.

Programmable logic 1302 further is coupled to a MP/FIFO* signal at node 1316 which selectively indicates whether dual-port/FIFO logic block 1300 will operate as a dual-port memory device or as a FIFO memory device. When MP/FIFO* comprises a high logic level, dual-port/ FIFO logic block 1300 operates as a dual-port memory device. When MP/FIFO* comprises a low logic level, dual-port/FIFO logic block 1300 operates as a FIFO memory device. MP/FIFO* may comprise a programmable configuration bit, be generated by a logic block with in the PLD, or be generated external to the PLD. Dual-port/FIFO logic block 1300 is capable of substantially performing a simultaneous read and write of data information in a similar manner as FIFO logic block 600 illustrated in FIG. 6 and multi-port logic block 900 illustrated in FIG. 9. That is, data and/or address information need not be shared or multiplexed when writing or reading from memory array 1304.

Programmable logic 1302 and memory array 1304 are coupled to port A address signals at node 1344 and port B address signals at node 1346. Programmable logic 1302 receives the port A and port B control signals, and may implement the control logic necessary to provide n bits of port A and port B address information to memory array 1304. Programmable logic 1302 also provides p bits of FIFO read and write information at node 1352. The p bits of read and write information may comprise n bits of read address information and/or n bits of write address information. The p bits of read and write information may also comprise read and write control information or other control information which indicates what memory array 1104 should do with the dual-port addresses at node 1344 and 1346 (including disregarding it altogether). M bits of port A data inputs are provided to memory array 1304 at node 1348, and m bits of port B data inputs are provide to memory array 1304 at node 1350. FIFO data inputs may be provided on either of the port A data inputs, port B data inputs, or a third bus of m bits. The data inputs are provided from a programmable interconnect matrix and may originate at dedicated input pins, I/O pins, or be generated by logic blocks with the PLD. M bits of data are output from memory array 1304 at nodes 1330 and 1332, and provided to programmable macrocells 1306. The m bits of data may comprise any number of parallel bits of information, including only one bit of data in a serial FIFO, or two bits of data for a single bit access dual-port memory device. Alternatively, a multiplexer may be coupled between memory array 1304 and programmable macrocells 1306 and selectively control which of the m bits of data at nodes 1332 and node 1330 are provided to programmable macrocells 1306. Programmable macrocells 1306 comprise logic elements such as multiplexers and register elements which may be utilized to further output k bits of data as data outputs at node 1308, wherein k may comprise m, 2m, or any number of required bits. Additionally, a PLD may include more than one dual-port/FIFO logic block in order to implement memory width and depth expansion as generally described with respect to FIGS. 6–10.

Figure 14:
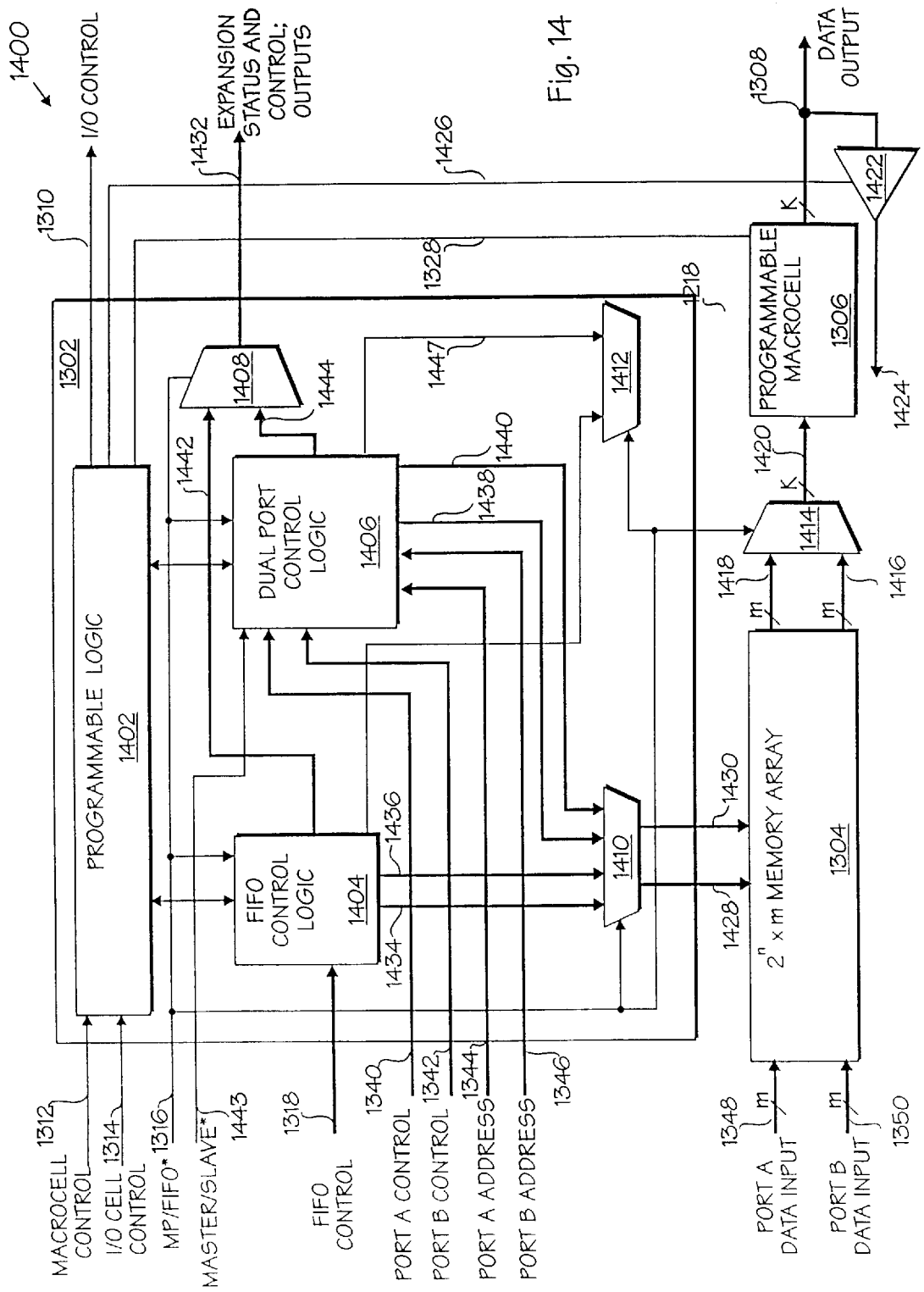
FIG. 14 illustrates another embodiment of a configurable memory block configured to function as either a FIFO or a dual-port memory device according to the present invention.

FIG. 14 illustrates dual-port/FIFO logic block 1400 comprising one embodiment of programmable logic 1302 configured to implement either a dual-port or a FIFO memory function. Programmable logic 1302 includes programmable logic 1402 coupled to FIFO control logic 1404 and dual-port control logic 1406. Data outputs at node 1308 are coupled to tri-state buffers 1422 and may be provided back to a programmable interconnect matrix at node 1424 in response to tri-state control signals provided by programmable logic 1402 at node 1426 (or directly from a programmable interconnect matrix). Each tri-state buffer may be coupled to its own control signal, or a plurality of tri-state buffers may share a control signal. FIFO control logic 1404 comprises control logic for implementing a FIFO function together with memory array 1304, and couples write and read pointer information to multiplexer 1410 at nodes 1434 and 1436. FIFO control logic 1404 may comprise, in one embodiment, the FIFO control logic 704 illustrated in FIG. 7. Dual-port control logic 1406 provides the necessary control logic in order to implement a dual-port memory function together with memory array 1304. It will be appreciated that the scope of the present invention may be extended to a multi-port memory having a plurality of ports. Dual-port control logic 1406 is coupled to Master/Slave* input signal at node 1443 and dual-port control logic 1406 may comprise, for example, dual-port control logic 1004 illustrated in FIG. 10. In response to the port A and port B address signals received by dual-port control logic 1406 at nodes 1340 and 1342, dual-port control logic 1406 will provide port A row and column address information at node 1438 to multiplexer 1410, and/or port B row and address information at node 1440 to multiplexer 1410. Additionally, port A and port B read or write control signals or other control signals for memory array 1304 may be provided at nodes 1438 and 1440.

As previously described, MP/FIFO* selectively controls whether dual-port/FIFO logic block 1400 will function as a dual-port memory device or a FIFO memory device. MP/FIFO* at node 1316 is coupled to multiplexers 1408, 1410, 1412 and 1414. MP/FIFO* selectively controls whether multiplexer 1410 will provide dual-port control, row and/or column information for ports A and B, or FIFO control, read and/or write information to memory array 1304 at nodes 1428 and 1430. When MP/FIFO* comprises a high logic level, multiplexer 1410 provides port A and port B row, address, and control information to nodes 1428 and 1430. When MP/FIFO* comprises a low logic level, multiplexer 1410 provides FIFO read, write, and control information to nodes 1428 and 1430. Additionally, MP/FIFO* selectively controls whether multiplexer 1408 provides FIFO outputs (expansion and status outputs) at node 1442 or dual-port outputs (control outputs) at node 1444 will be provided as expansion, status and control outputs at node 1432. The FIFO outputs at node 1442 comprise the expansion outputs and flag outputs at node 1324 and 1326 respectively in FIG. 13. The dual-port outputs at node 1444 comprise the dual-port control outputs at node 1320 in FIG. 13. In an alternative embodiment multiplexer 1408 may not be utilized such that FIFO expansion and flag outputs and the dual-port outputs may be output directly from dual-port/FIFO logic block 1400.

MP/FIFO* also selectively controls multiplexer 1412 which receives macrocell control signals from FIFO control logic 1404 at node 1445 and dual-port control logic 1406 at node 1447. These macrocell control signals may be utilized by programmable macrocells 1306 to control, for example, the clocking of register elements in response to arbitration results or FIFO flag outputs. Additionally, MP/FIFO* selectively controls multiplexer 1414 to determine which portion of signals at nodes 1416 and 1418 are provided to node 1420. In an alternative embodiment data at nodes 1418 and 1416 may be provided directly to programmable macrocells 1306. MP/FIFO* is also coupled to FIFO control logic 1404 and dual-port control logic 1406 and may be used to enable and disable the control logic blocks accordingly.

In an alternative embodiment, the FIFO control signals at node 1318 and the port A and port B control signals at nodes 1340 and 1342 respectively, may be shared in order to reduce the number of signals required for dual-port/FIFO logic block 1400. In one embodiment, a FIFO read control signal and a dual-port chip read/write signal for port A (or port B) may share the same signal. This shared signal is coupled to read control logic in FIFO control logic 1404, and is coupled to port A control logic within dual-port control logic 1406. When MP/FIFO* comprises a high logic level, this shared signal functions as a read/write signal for dual-port control logic 1406. Similarly, when MP/FIFO* comprises a low logic level, this signal functions as a read enable signal for FIFO control logic 1404. Similarly, a FIFO write control signal and a dual-port read/write signal for port B (or port A) may share the same signal. This shared signal is coupled to write control logic in FIFO control logic 1404, and is coupled to port B control logic within dual-port control logic 1406. When MP/FIFO* comprises a high logic level, this shared signal would function as a read/write signal for port B of dual-port control logic 1406. Similarly, when MP/FIFO* comprises a low logic level, this shared signal functions as a write enable signal for FIFO control logic 1404.

In another embodiment of SRAM/FIFO block 1400, the FIFO reset control signal may be shared with a dual-port Master/Slave* control signal. This shared signal is coupled to the reset control logic of FIFO control logic 1404, and to the arbitration logic of dual-port control logic 1406. When MP/FIFO* comprises a high logic level, this shared signal functions as the Master/Slave* dual-port signal. Similarly, when MP/FIFO* comprises a low logic level, this shared signal functions as a reset control signal for FIFO control logic 1404. In another embodiment, the FIFO expansion input signals (e.g. XI* or FL*) may be shared with the dual-port busy input control signals. These shared signals are coupled to expansion logic within FIFO control logic 1404, and to arbitration logic within dual-port control logic 1406. When MP/FIFO* comprises a high logic level, these shared signals function as the busy input dual-port control signals. Similarly, when MP/FIFO* comprises a low logic level, these shared signals function as expansion control signals for FIFO control logic 1404. It will be appreciated that other signals or combinations of signals may be shared between FIFO control logic 1404 and dual-port control logic 1406 within the scope of the present invention.

Figure 15:
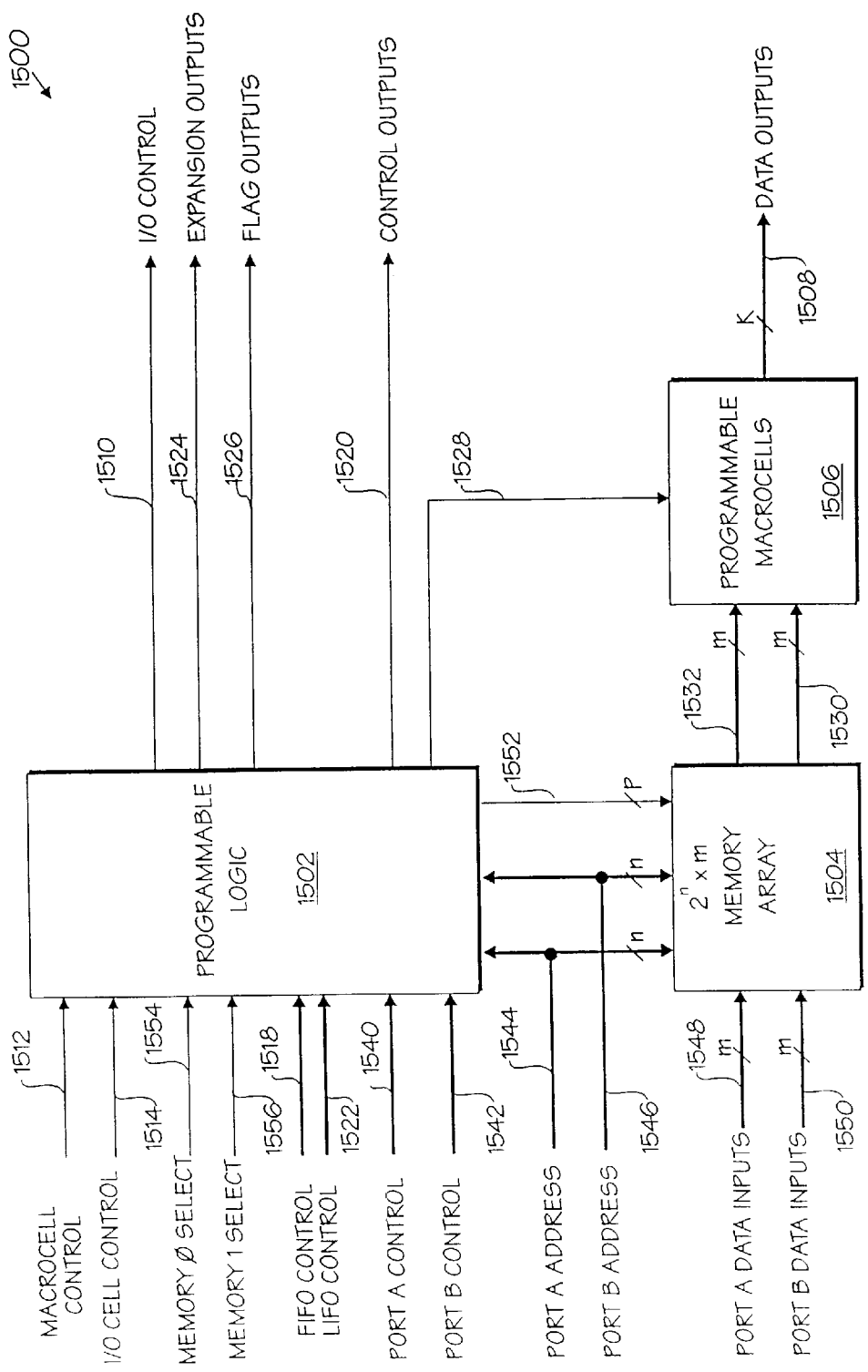
FIG. 15 illustrates one embodiment of a configurable memory block configured to function as either a FIFO memory device, a LIFO memory device, a single-port memory device, or a dual-port memory device according to the present invention.

FIG. 15 illustrates another embodiment of the configurable memory block 528 illustrated in FIG. 5. FIG. 15 shows a configurable memory block 1500 comprising programmable logic 1502 coupled to $2^n \times m$ memory array 1504 and programmable macrocells 1506. Configurable memory block 1500 is configurable to implement either a dual-port memory device (e.g. dual-port RAM), a single-port memory device, a LIFO memory device, or a FIFO memory device. It will also appreciated that configurable memory block 1500 may be extended from a dual-port configuration to a multi-port configuration by providing more access ports to programmable logic 1502 and memory array 1504. As with conventional programmable logic in a logic block of a PLD, programmable logic 1502 receives macrocell control signals at node 1512 and I/O cell control signals at node 1514, performs logic functions on these signals and outputs programmable macrocell control signals at node 1528 and I/O control signals at node 1510. Programmable logic 1502 is coupled to FIFO control signals at node 1518 and outputs FIFO expansion outputs at node 1524 and flag outputs at node 1526. Additionally, programmable logic 1502 is coupled to LIFO control signals at node 1520 and may alternatively output LIFO expansion outputs at node 1524 (or a new output node) and flag outputs at node 1526 (or a new output node). The FIFO control signals, expansion outputs and flag outputs comprise, for example, the FIFO control signals, expansion outputs and flag outputs described with respect to FIFO logic block 600 illustrated in FIG. 6. Programmable logic 1502 additionally receives dual-port control 1540 an comprising port A control signals at node 1540 and port B control signals at node 1542. Dual-port control signals may include, for example, the port A and port B control signals described with respect to multi-port logic block 900 illustrated in FIG. 9. In a similar manner, programmable logic 1502 outputs dual-port control outputs at node 1520 which may comprise, for example, the dual-port control outputs described with respect to multi-port logic block 900 illustrated in FIG. 9. Additionally, the LIFO outputs, FIFO outputs and dual-port control outputs may be provided to programmable macrocells, such as programmable macrocells 1506 or another block of programmable macrocells included in configurable memory block 1500. Configurable memory block 1500 also implements a single-port memory device by simply using either port A or port B of the multi-port memory device.

Programmable logic 1502 further is coupled to a memory 0 select at node 1554, and memory 1 select at node 1556. These signals selectively indicate whether configurable memory block 1500 will operate as a dual-port memory device, a single-port memory device, a LIFO memory device, or a FIFO memory device. Any unique combination of memory 0 select and memory 1 select may be used for selecting the various memory device types. For example, when memory 1 select and memory 0 select each comprise a high logic level, configurable memory block 1500 operates as a LIFO memory device. When memory 1 select comprises a high logic level and memory 0 select comprises a low logic level, configurable memory block 1500 operates as a FIFO memory device. When memory 1 select comprises a low logic level and memory 0 select comprises a high logic level, configurable memory block 1500 comprises a multi-port memory device and a single-port memory device. When memory 1 select comprises a low logic level and memory 0 select comprises a low logic level, configurable memory block 1500 is either disabled, remains in the same state or performs some other predetermined function. When configurable memory block 1500 operates as a FIFO, LIFO, or multi-port memory device, configurable memory block 1500 is capable of substantially performing a simultaneous read and write of data information in a similar manner as FIFO logic block 600 illustrated in FIG. 6 and multi-port logic block 900 illustrated in FIG. 9. That is, data and/or address information need not be shared or multiplexed when writing or reading from memory array 1504.

Programmable logic 1502 and memory array 1504 are coupled to port A address signals at node 1544 and port B address signals at node 1546. Programmable logic 1502 receives the port A and port B control signals, and may implement the control logic necessary to provide n bits of port A and port B address information to memory array 1504. Programmable logic 1502 also provides p bits of FIFO read and write information at node 1552. The p bits of read and write information may comprise n bits of read address information and/or n bits of write address information. The p bits of read and write information may also comprise read and write control information or other control information which indicates what memory array 1104 should do with the dual-port addresses at node 1544 and 1546 (including disregarding it altogether). M bits of port A data inputs are provided to memory array 1504 at node 1548, and m bits of port B data inputs are provide to memory array 1504 at node 1550. FIFO and/or LIFO data inputs may be provided on either of the port A data inputs, port B data inputs, or a third and/or fourth bus of m bits each. M bits of data are output from memory array 1504 at nodes 1530 and 1532, and provided to programmable macrocells 1506. The m bits of data may comprise any number of parallel bits of information including only one bit of data in a serial FIFO or LIFO memory device, one bit of data in a single bit access single-port memory device, or two bits of data for a single bit access dual-port memory device. The data inputs are provided from a programmable interconnect matrix and may originate at dedicated input pins, I/O pins, or be generated by logic blocks with the PLD. Alternatively, a multiplexer may be coupled between memory array 1504 and programmable macrocells 1506 and selectively control which of the m bits of data at nodes 1532 and node 1530 are provided to programmable macrocells 1506. Programmable macrocells 1506 comprise logic elements such as multiplexers and register elements which may be utilized to further output k bits of data as data outputs at node 1508, wherein k may comprise m, 2m, or any number of required bits. Additionally, a PLD may include more than one configurable memory block in order to implement memory width and depth expansion as previously described with respect to FIGS. 6–10.

Figure 16:
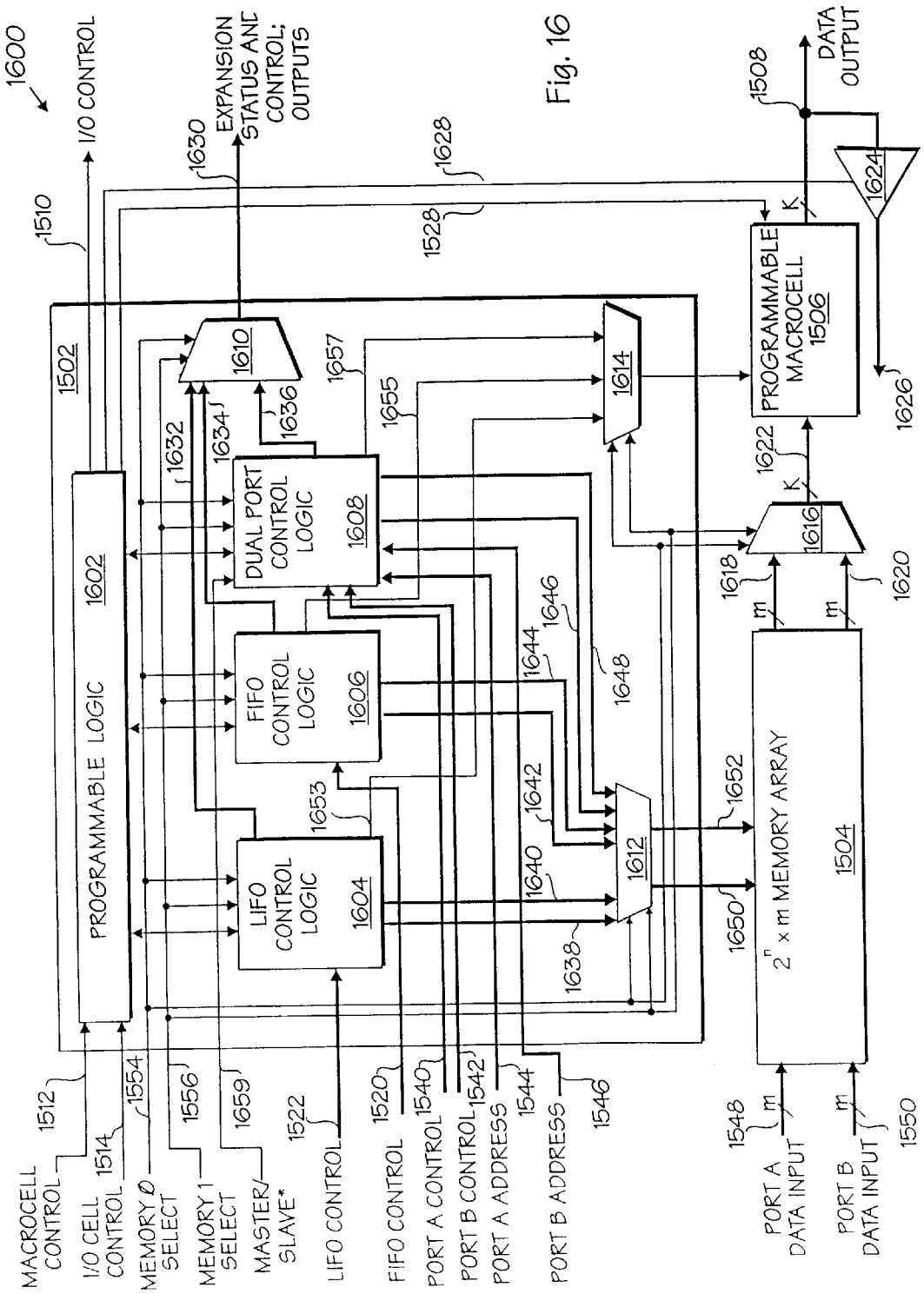
FIG. 16 illustrates another embodiment of a configurable memory block configured to function as either a FIFO memory device, a LIFO memory device, a single-port memory device, or a dual-port memory device according to the present invention.

FIG. 16 illustrates configurable memory block 1600 comprising one embodiment of programmable logic 1502 configured to implement either a dual-port memory device, a single-port memory device, a LIFO memory device, or a FIFO memory device. Programmable logic 1502 includes programmable logic 1602 coupled to LIFO control logic 1604, FIFO control logic 1606 and dual-port control logic 1608. Data outputs at node 1508 are coupled to tri-state buffers 1624 and may be provided back to a programmable interconnect matrix at node 1626 in response to the tri-state control signals provided by programmable logic 1602 at node 1628 (or from a programmable interconnect matrix). Each tri-state buffer may be coupled to its own control signal, or a plurality of tri-state buffers may share a single control signal. LIFO control logic 1604 comprises control logic for implementing a LIFO function together with memory array 1504, and couples write and read pointer information to multiplexer 1612 at nodes 1638 and 1640. FIFO control logic 1606 comprises control logic for implementing a FIFO function together with memory array 1504, and couples write and read pointer information to multiplexer 1612 at nodes 1642 and 1644. FIFO control logic 1404 may comprise, in one embodiment, the control logic 704 illustrated in FIG. 7. FIFO control logic 1606 and LIFO control logic 1604 may also be included within the same control logic block and respond according to the signals on memory 0 select and memory 1 select. Dual-port control logic 1608 is coupled to Master/Slave* input signal at node 1651 and provides the necessary control logic in order to implement a dual-port memory function together with memory array 1504. Dual-port control logic 1608 may also implement a single-port memory device when only one of port A or port B is utilized. It will be appreciated that the scope of the present invention may be extended to a multi-port memory having a plurality of ports. Dual-port control logic 1608 may comprise, for example, control logic 1004 illustrated in FIG. 10. In response to the port A and port B address signals received by dual-port control logic 1608 at nodes 1540 and 1542, dual-port control logic 1608 provides port A row and column address information at node 1646 to multiplexer 1612, and/or port B row and address information at node 1648 to multiplexer 1612. Additionally, port A and port B read or write control signals or other control signals for memory array 1504 may be provided at nodes 1646 and 1648.

As previously described, memory 0 select and memory 1 select selectively control whether configurable memory block 1600 will function as a dual-port memory device, a single-port memory device, a LIFO memory device, or a FIFO memory device. Memory 0 select and memory 1 select are coupled to multiplexers 1610, 1612, 1614 and 1616. Any unique combination of memory 0 select and memory 1 select may be used for selecting the various memory device types. With respect to configurable memory block 1600, when both memory 1 select and memory 0 select comprise a high logic level, multiplexer 1612 is selectively enabled to provide the LIFO read, write, and control information at nodes 1638 and 1640 to memory array 1504 at nodes 1650 and 1652. When memory 1 select comprises a high logic level and memory 0 select comprises a low logic level, multiplexer 1612 is selectively enabled to provide FIFO read, write, and control information at nodes 1642 and 1644 to memory array 1504 at nodes 1650 and 1652. When memory 1 select comprises a low logic level and memory 0 select comprises a high logic level, multiplexer 1612 is selectively enabled to provide the dual-port port A and port B row, column, and control information at nodes 1646 and 1648 to memory array 1504 at nodes 1650 and 1652.

Additionally, memory 0 select and memory 1 select control whether multiplexer 1610 will provide as expansion, status and control outputs at node 1630 the LIFO outputs at node 1632, FIFO outputs at node 1634 or dual-port outputs at node 1636. The LIFO and FIFO outputs at nodes 1632 and 1634 comprise, for example, the expansion outputs and flag outputs at nodes 1324 and 1326 illustrated in FIG. 13. The dual-port outputs at node 1636 comprise, for example, the dual-port control outputs at node 1320 in FIG. 13. In an alternative embodiment multiplexer 1610 may not be utilized such that LIFO and FIFO expansion and flag outputs, and the dual-port outputs, may be output directly from configurable memory block 1600. Memory 0 select and memory 1 select also control multiplexer 1614. Multiplexer 1614 receives macrocell control signals from LIFO control logic 1604 at node 1653, FIFO control logic 1606 at node 1655, and dual-port control logic 1608 at node 1657. These macrocell control signals may be utilized by programmable macrocells 1506 to control, for example, the clocking of register elements in response to arbitration results of LIFO/FIFO flag outputs. Additionally, memory 0 select and memory 1 select control multiplexer 1616 to determine which portion of signals at nodes 1618 and 1620 are provided to node 1622. In an alternative embodiment data at nodes 1618 and 1620 may be provided directly to programmable macrocells 1506. Memory 0 select and memory 1 select are also coupled to LIFO control logic 1604, FIFO control logic 1606 and dual-port control logic 1608 and may be used to enable and disable the control logic blocks accordingly.

In an alternative embodiment, the LIFO, FIFO and dual-port control signals may be shared in order to reduce the number of signals required for configurable memory block 1600. These signals may be shared as was previously described with respect to SRAM/FIFO logic block 1200 illustrated in FIG. 12 and dual-port/FIFO logic block 1400 illustrated in FIG. 14, or in other useful combinations.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programmable logic device comprising:

an input;

an interconnect matrix coupled to said input; and a plurality of logic blocks coupled to said interconnect matrix, wherein one of said plurality of logic blocks comprises:

a first programmable logic element coupled to the interconnect matrix, said first programmable logic element receiving a first plurality of control signals and a plurality of address signals from said interconnect matrix, and outputting a second plurality of control signals; and a multi-port storage element having a plurality of ports, wherein said multi-port storage element is coupled to the interconnect matrix and the first programmable logic element, said multi-port storage element receiving said second plurality of control signals from said first programmable logic element and receiving a plurality of data input signals and the plurality of address signals from said interconnect matrix, said multi-port storage element outputting a first plurality of data signals.

2. The programmable logic device of claim 1, wherein said one of said plurality of logic blocks is operative to function as a single-port memory device.

3. The programmable logic device of claim 1, wherein said one of said plurality of logic blocks is operative to function as a first-in-first-out (FIFO) memory device.

4. The programmable logic device of claim 1, wherein said one of said plurality of logic blocks is operative to function as a last-in-first-out (LIFO) memory device.

5. The programmable logic device of claim 1, wherein:

said one of said plurality of logic blocks receives a memory select signal, said multi-port storage element functions as one of a plurality of memory devices in response to said memory select signal.

6. The programmable logic device of 5, wherein:

said memory select signal comprises a first memory select signal and a second memory select signal.

7. The programmable logic device of claim 1, wherein said one of said plurality of logic blocks further comprises:

a second programmable logic element coupled to the first programmable logic element and the multi-port storage element, the second programmable logic element receiving the first plurality of data output signals and generating a second plurality of data output signals.

8. The programmable logic device of claim 1, wherein said first plurality of control signals comprise single-port memory control signals.

9. The programmable logic device of claim 1, wherein the first plurality of control signals includes a set of multi-port memory control signals for each of said plurality of ports.

10. The programmable logic device of claim 1, wherein said first plurality of control signals comprise first-in-first-out (FIFO) control signals.

11. The programmable logic device of claim 10, wherein said first plurality of control signals further comprise a FIFO expansion input signal.

12. The programmable logic device of claim 1, wherein said first programmable logic element further outputs a first-in-first-out (FIFO) expansion output signal.

13. The programmable logic device of claim 1, wherein said first programmable logic element further outputs a multi-port busy output signal.

14. The programmable logic device of claim 1, wherein:

the multi-port storage element comprises a first multi-port storage element;

another one of said plurality of logic blocks includes a second multi-port storage element; and said first multi-port storage element and said second multi-port storage element may be coupled together to form a third multi-port storage element.

15. The programmable logic device of claim 14, wherein:

the first multi-port storage element has a first data width and a first storage depth;

the second multi-port storage element has a second data width and a second storage depth; and the third multi-port storage element has a third data width and a third storage depth.

16. The programmable logic device of claim 15, wherein:

the third data width of the third multi-port storage element is equal to the first data width of the first multi-port storage element plus the second data width of the second multi-port storage element.

17. The programmable logic device of claim 15, wherein:

the third storage depth of the third multi-port storage element is equal to the first storage depth of the first multi-port storage element plus the second storage depth of the second multi-port storage element.

18. The programmable logic device of claim 1, wherein the first programmable logic element comprises multi-port control logic.

19. The programmable logic device of claim 18, wherein the multi-port control logic comprises arbitration logic and address compare logic, the arbitration logic coupled to the address compare logic and the first plurality of control signals, the address compare logic coupled to the plurality of address signals.

20. The programmable logic device of claim 18, wherein the first programmable logic element further comprises first-in-first-out (FIFO) control logic.

21. The programmable logic device of claim 20, wherein the first programmable logic element further comprises a programmable logic block coupled to the multi-port control logic and the FIFO control logic.

22. The programmable logic device of claim 1, wherein the plurality of data input signals includes a set of data input signals for each of said plurality of ports of said multi-port storage element.

23. The programmable logic device of claim 1, wherein the first plurality of data output signals includes a set of data output signals for each of said plurality of ports of said multi-port storage element.

24. The programmable logic device of claim 1, wherein the interconnect matrix comprises a programmable interconnect matrix.

25. A programmable logic device comprising:

an input;

an interconnect matrix coupled to the input; and a plurality of logic blocks coupled to said interconnect matrix, wherein one of said plurality of logic blocks comprises:

a first programmable logic element coupled to the interconnect matrix, said first programmable logic element receiving a first plurality of control signals from said interconnect matrix and outputting a second plurality of control signals; and a first-in-first-out (FIFO) storage element coupled to the interconnect matrix and the first programmable logic element, said FIFO storage element receiving said second plurality of control signals from said first programmable logic element and receiving a plurality of data input signals from said interconnect matrix, said FIFO storage element outputting a first plurality of data signals, wherein said first plurality of control signals includes FIFO control signals for controlling the operation of the FIFO storage element, wherein the FIFO control signals comprise expansion control signals controlling depth expansion of the FIFO storage element, wherein data may be substantially simultaneously written to and read from said FIFO storage element.

26. The programmable logic device of claim 25, wherein said one of said plurality of logic blocks further comprises:

a second programmable logic element coupled to the first programmable logic block and the FIFO storage element, the second programmable logic element receiving the first plurality of data output signals and generating a second plurality of data output signals.

27. The programmable logic device of claim 25, wherein:

the FIFO storage element comprises a first FIFO storage element;

another one of said plurality of logic blocks includes a second FIFO storage element; and said first FIFO storage element and said second FIFO storage element may be coupled together to form a third FIFO storage element.

28. The programmable logic device of claim 27, wherein:

the first FIFO storage element has a first data width and a first storage depth;

the second FIFO storage element has a second data width and a second storage depth; and the third FIFO storage element has a third data width and a third storage depth.

29. The programmable logic device of claim 28, wherein:

the third data width of the third FIFO storage element is equal to the first data width of the first FIFO storage element plus the second data width of the second FIFO storage element.

30. The programmable logic device of claim 28, wherein:

the third storage depth of the third FIFO storage element is equal to the first storage depth of the first FIFO storage element plus the second storage depth of the second FIFO storage element.

31. The programmable logic device of claim 25, wherein the first programmable logic element comprises FIFO control logic.

32. The programmable logic device of claim 31, wherein the first programmable logic element further comprises a programmable logic block coupled to the FIFO control logic.

33. The programmable logic device of claim 25, wherein the interconnect matrix comprises a programmable interconnect matrix.

34. A programmable logic device comprising:

an input:

an interconnect matrix coupled to the input; and a plurality of logic blocks coupled to said interconnect matrix, wherein one of said plurality of logic blocks comprises:

a first programmable logic element coupled to the interconnect matrix, said first programmable logic element receiving a first plurality of control signals from said interconnect matrix and outputting a second plurality of control signals and a FIFO expansion output signal; and a first-in-first-out (FIFO) storage element coupled to the interconnect matrix and the first programmable logic element, said FIFO storage element receiving said second plurality of control signals from said first programmable logic element and receiving a plurality of data input signals from said interconnect matrix, said FIFO storage element outputting a first plurality of data signals, wherein data may be substantially simultaneously written to and read from said FIFO storage element.

* * * * *